(12) United States Patent
Nguyen et al.

(10) Patent No.: US 9,036,710 B2
(45) Date of Patent: May 19, 2015

(54) UNIFIED TRANSFORM COEFFICIENT ENCODING AND DECODING

(75) Inventors: Nguyen Nguyen, Waterloo (CA); Tianying Ji, Waterloo (CA); Dake He, Waterloo (CA)

(73) Assignee: BlackBerry Limited, Waterloo, ON (CA)

( * ) Notice: Subject to any disclaimer, the term of this patent is extended or adjusted under 35 U.S.C. 154(b) by 524 days.

(21) Appl. No.: 13/446,393

(22) Filed: Apr. 13, 2012

(65) Prior Publication Data

US 2013/0235925 A1     Sep. 12, 2013

Related U.S. Application Data

(60) Provisional application No. 61/608,256, filed on Mar. 8, 2012.

(51) Int. Cl.
| | |
|---|---|
| H04B 1/66 | (2006.01) |
| H04N 7/12 | (2006.01) |
| H04N 11/02 | (2006.01) |
| H04N 11/04 | (2006.01) |
| H03M 7/40 | (2006.01) |
| H04N 19/176 | (2014.01) |
| H04N 19/13 | (2014.01) |
| H04N 19/61 | (2014.01) |
| H04N 19/14 | (2014.01) |
| H04N 19/18 | (2014.01) |
| H04N 19/182 | (2014.01) |
| H03M 7/30 | (2006.01) |

(52) U.S. Cl.
CPC .......... *H03M 7/4006* (2013.01); *H03M 7/4018* (2013.01); *H03M 7/6011* (2013.01); *H03M 7/6017* (2013.01); *H04N 19/176* (2014.01); *H04N 19/13* (2014.01); *H04N 19/61* (2014.01); *H04N 19/14* (2014.01); *H04N 19/18* (2014.01); *H04N 19/182* (2014.01)

(58) Field of Classification Search
USPC ......................................................... 375/240
See application file for complete search history.

(56) References Cited

U.S. PATENT DOCUMENTS

| | | | | |
|---|---|---|---|---|
| 5,864,681 | A | * | 1/1999 | Proctor et al. ................. 709/247 |
| 5,926,226 | A | * | 7/1999 | Proctor et al. ............ 375/240.22 |

(Continued)

OTHER PUBLICATIONS

Chen J et al: "Non-CE1: throughput improvement on CABAC coefficients level coding". 8. JCT-VC Meeting; 99. MPEG Meeting; Jan. 2, 2012-Oct. 2, 2012; San Jose; (Joint Collaborative Team on Video Coding of ISO/IEC JTC1/SC29/WG11 and ITU-T SG.16 ); URL: http://wftp3.itu.int/av-arch/jctvc-site/. No. JCTVC-H0554. Jan. 24, 2012. XP030111581.

(Continued)

*Primary Examiner* — Joseph Ustaris
*Assistant Examiner* — Talha Nawaz
(74) *Attorney, Agent, or Firm* — Rowand LLP

(57) ABSTRACT

Methods and devices for reconstructing coefficient levels from a bitstream of encoded video data for a coefficient group in a transform unit, using adaptive-threshold-based level coding. Threshold is set based upon level information from one or more previously-reconstructed coefficient groups in the transform unit. Threshold may be maximum number of level flags to decode for the coefficient group. Level information may include number of level flags decoded in previous coefficient groups. Previously-reconstructed coefficient groups may include coefficient group to the right and below the current coefficient group.

21 Claims, 12 Drawing Sheets

(56) References Cited

U.S. PATENT DOCUMENTS

| | | | | |
|---|---|---|---|---|
| 6,072,830 | A * | 6/2000 | Proctor et al. | 375/240.22 |
| 2012/0093217 | A1* | 4/2012 | Jeon et al. | 375/240.02 |
| 2013/0003858 | A1* | 1/2013 | Sze | 375/240.18 |
| 2013/0003859 | A1* | 1/2013 | Karczewicz et al. | 375/240.24 |
| 2013/0343463 | A1* | 12/2013 | Terada et al. | 375/240.18 |
| 2014/0003533 | A1* | 1/2014 | He et al. | 375/240.25 |

OTHER PUBLICATIONS

Zhang W et al: "Non-CE1: On CABAC parsing throughput". 8. JCT-VC Meeting; 99. MPEG Meeting; Jan. 2, 2012-Oct. 2, 2012; San Jose; (Joint Collaborative Team on Video Coding of ISO/IEC JTC1/SC29/WG11 and ITU-T SG.16 ); URL: http://wftp3.itu.int/av-arch/jctvc-site/. No. JCTVC-H0533.

Kim S H et al: "Non-CEI:High Throughput Binarization (HTB) method with modified level coding". 8. JCT-VC Meeting; 99. MPEG Meeting; Jan. 2, 2012-Oct. 2, 2012; San Jose; (Joint Collaborative Team on Video Coding of ISO/IEC JTC1/SC29/WG11 and ITU-T SG.16 ); URL: http://wftp3.itu.int/av-/jctvc-site/. No. JCTVC-H0510. Jan. 21, 2012. XP030111537.

Extended European Search Report dated Aug. 17, 2012.

B. Bross, W-J Han, J-R Ohm, G. J. Sullivan, and T. Wiegand, "WD5: Working Draft 5 of High-Efficiency Video Coding", JCTVC-G1103, JCT-VC of ITU-T SG16 WP3 and ISO/IEC JTC1/SC29/WG11, 8th Meeting, San Jose, Feb. 2012.

J. Xu, and A. Tabatabai, "Harmonization of Coefficient Coding", JCTVC-H0399, JCT-VC of ITU-T SG16 WP3 and ISO/IEC JTC1/SC29NVG11, 8th Meeting, San Jose, Feb. 2012.

F. Bossen, "Common HM test conditions and software reference configurations", JCTVC-G1200, JCT-VC of ITU-T SG16 WP3 and ISO/IEC JTC1/SC29NVG11, 7th Meeting, Geneva, Nov. 2011.

T. Nguyen, D. Marpe, and T. Wiegand, "Proposed Cleanup of Transform Coefficient coding", JCTVC-H0228, JCT-VC of ITU-T SG16 WP3 and ISO/IEC JTC1/SC29/WG11, 8th Meeting, San Jose, Feb. 2012.

N. Nguyen, T. Ji, D. He, and G. Martin-Cocher, "Multi-level Significance Maps for Small TUs", JCTVC-H0526, JCT-VC of ITU-T SG16 WP3 and ISO/IEC JTC1/SC29/WG11, 8th Meeting, San Jose, Feb. 2012.

J. Sole, R. Joshi, and M. Karczewicz, "Diagonal Sub-block Scan for Residual HE Coding", JCTVC-G323, JCT-VC of ITU-T SG16 WP3 and ISO/IEC JTC1/SC29/WG11, 7th Meeting, Geneva, Nov. 2011.

N. Nguyen, T. Ji, D. He, L. Song, and G. Martin-Cocher, "Multi-level Significance Maps for Large TUs", JCTVC-G644, JCT-VC of ITU-T SG16 WP3 and ISO/IEC JTC1/SC29/WG11, 7th Meeting, Geneva, Nov. 2011.

* cited by examiner

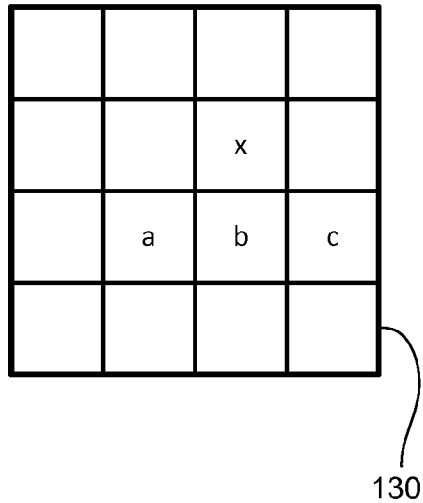
FIG. 4
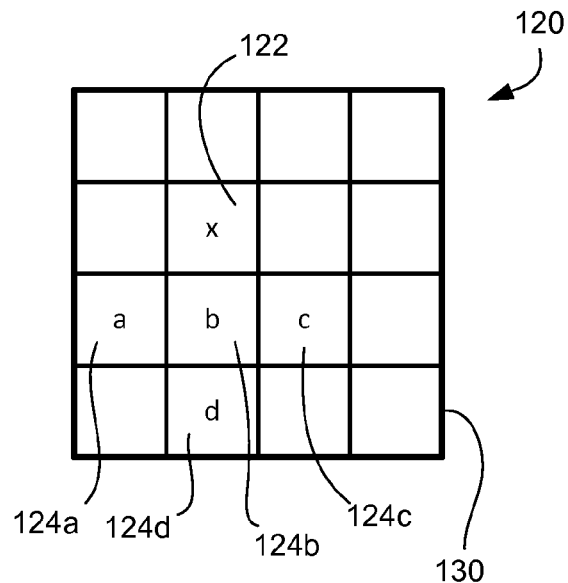
FIG. 5
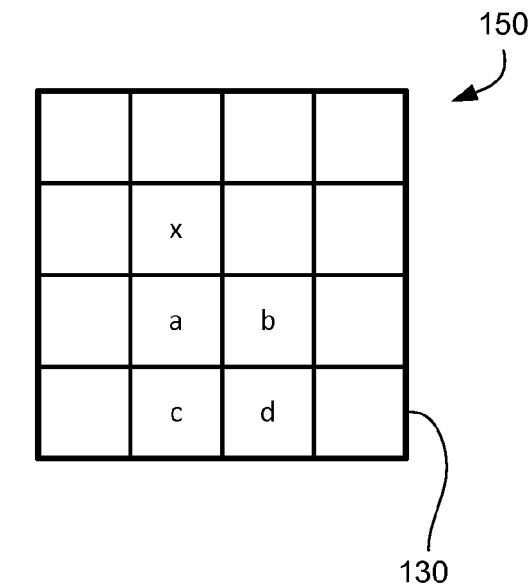
FIG. 6        FIG. 7

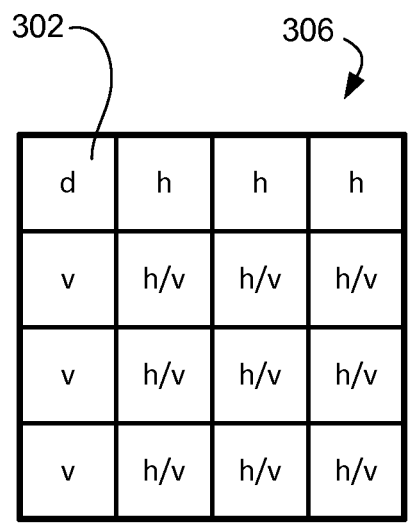
FIG. 16        FIG. 17
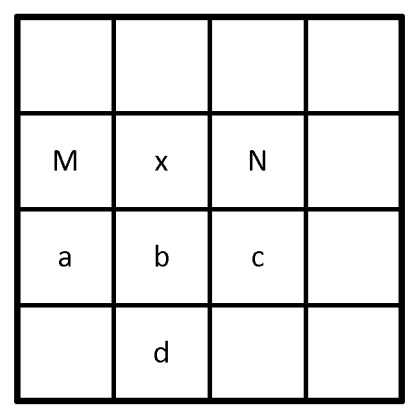
FIG. 18        FIG. 19

UNIFIED TRANSFORM COEFFICIENT ENCODING AND DECODING

CROSS-REFERENCE TO RELATED APPLICATIONS

The present application claims priority to U.S. patent application Ser. No. 61/608,256, filed Mar. 8, 2012, and owned in common herewith, the contents of which are hereby incorporated by reference.

COPYRIGHT NOTICE

A portion of the disclosure of this document and accompanying materials contains material to which a claim for copyright is made. The copyright owner has no objection to the facsimile reproduction by anyone of the patent document or the patent disclosure, as it appears in the Patent and Trademark Office files or records, but reserves all other copyright rights whatsoever.

FIELD

The present application generally relates to data compression and, in particular, to methods and devices for encoding and decoding transform coefficients, specifically in the case of video coding.

BACKGROUND

Data compression occurs in a number of contexts. It is very commonly used in communications and computer networking to store, transmit, and reproduce information efficiently. It finds particular application in the encoding of images, audio and video. Video presents a significant challenge to data compression because of the large amount of data required for each video frame and the speed with which encoding and decoding often needs to occur. The current state-of-the-art for video encoding is the ITU-T H.264/AVC video coding standard. It defines a number of different profiles for different applications, including the Main profile, Baseline profile and others. A next-generation video encoding standard is currently under development through a joint initiative of MPEG-ITU termed High Efficiency Video Coding (HEVC). The initiative may eventually result in a video-coding standard that will form part of a suite of standards referred to as MPEG-H.

There are a number of standards for encoding/decoding images and videos, including H.264, that use block-based coding processes. In these processes, the image or frame is divided into blocks, typically 4×4 or 8×8, and the blocks are spectrally transformed into coefficients, quantized, and entropy encoded. In many cases, the data being transformed is not the actual pixel data, but is residual data following a prediction operation. Predictions can be intra-frame, i.e. block-to-block within the frame/image, or inter-frame, i.e. between frames (also called motion prediction). It is expected that HEVC will also have these features.

When spectrally transforming residual data, many of these standards prescribe the use of a discrete cosine transform (DCT) or some variant thereon. The resulting DCT coefficients are then quantized using a quantizer to produce quantized transform domain coefficients, or indices.

The block or matrix of quantized transform domain coefficients (sometimes referred to as a "transform unit") is then entropy encoded using a particular context model. In H.264/AVC and in the current development work for HEVC, the quantized transform coefficients are encoded by (a) encoding a last significant coefficient position indicating the location of the last non-zero coefficient in the transform unit, (b) encoding a significance map indicating the positions in the transform unit (other than the last significant coefficient position) that contain non-zero coefficients, (c) encoding the magnitudes of the non-zero coefficients, and (d) encoding the signs of the non-zero coefficients. This encoding of the quantized transform coefficients often occupies 30-80% of the encoded data in the bitstream.

BRIEF DESCRIPTION OF THE DRAWINGS

Reference will now be made, by way of example, to the accompanying drawings which show example embodiments of the present application, and in which:

FIG. 4 shows the indexing of positions in a 4×4 coefficient group;

FIGS. 5 through 10 show illustrations of example context templates for particular scan orders;

FIGS. 11 through 13 show illustrations of multi-level context templates;

FIGS. 14 through 16 show example coefficient-level scan order assignments to coefficient groups of an example transform unit;

FIG. 17 shows the minimum number of significant-coefficients to be encoded using the best of horizontal or vertical scan order in the case where the coefficient group contains one bin, and that bin is the last significant coefficient;

FIG. 18 shows the minimum number of significant-coefficients to be encoded under the same conditions as FIG. 17 if using diagonal scan order;

FIG. 19 shows another example of a multi-level context template for use in the case of scan-line interleaving;

Similar reference numerals may have been used in different figures to denote similar components.

DESCRIPTION OF EXAMPLE EMBODIMENTS

Figure 1:
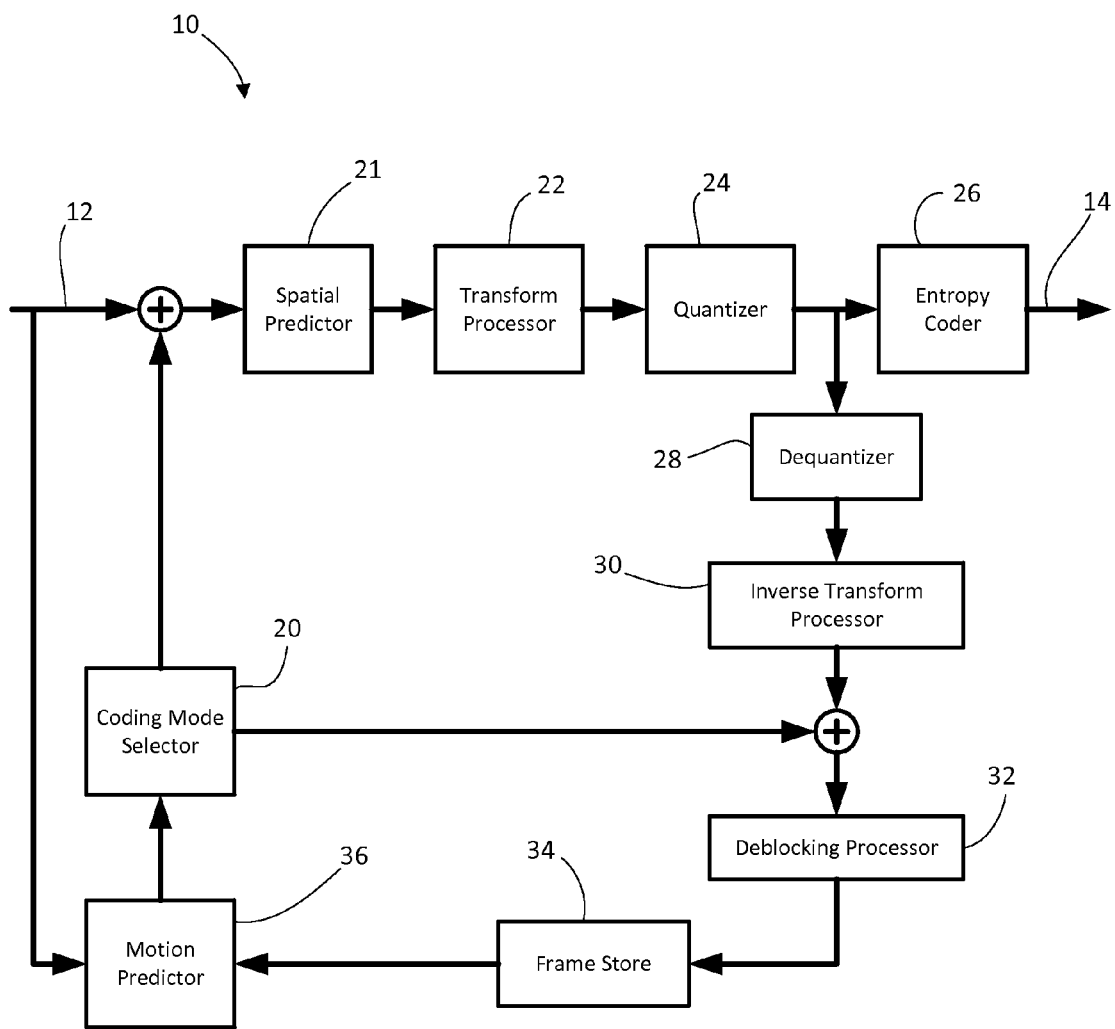
FIG. 1 shows, in block diagram form, an encoder for encoding video.

The present application describes methods and encoders/decoders for encoding and decoding residual video data. In particular, the present application describes methods and encoders/decoders for context-adaptive coding of quantized transform coefficients.

In a first aspect, the present application describes a method of decoding a bitstream of encoded video by reconstructing significant-coefficient flags for a transform unit, the transform unit having columns and rows, the reconstruction proceeding in a scan order from a lower right corner of the transform unit to an upper left corner of the transform unit, wherein the scan order is either horizontal or vertical. The method includes determining a context for a significant-coefficient flag dependent upon the values of a plurality of nearby previously reconstructed significant-coefficient flags within the transform unit, wherein the plurality of nearby previously reconstructed significant-coefficient flags does not include any of the nearby previously reconstructed significant-coefficient flags within two positions of that significant-coefficient flag in the scan order; and decoding that significant-coefficient flag from the bitstream using its determined context.

In a further aspect, the present application describes a method of decoding a bitstream of encoded video by reconstructing transform coefficients, wherein the bitstream includes significant-coefficient flags for a coefficient group and one or more level elements for non-zero coefficients in the coefficient group, and the reconstruction proceeding in a scan order from a lower right corner of the coefficient group to an upper left corner of the coefficient group. The method includes determining a context for a level element in a position in the coefficient group, partly based upon the value of a previously reconstructed significant-coefficient flag within the coefficient group in a nearby position neighboring the position of the level element; and decoding that level element from the bitstream using its determined context.

In another aspect, the present application describes a method of decoding a bitstream of encoded video by reconstructing transform coefficients, wherein the bitstream includes a transform unit partitioned into coefficient groups, each coefficient group having columns and rows, wherein for each coefficient group the reconstruction proceeds in a scan order from a lower right corner of that coefficient group to an upper left corner of that coefficient group, and wherein the scan order is either horizontal or vertical. The method includes, for one of the coefficient groups, reconstructing significant-coefficient flags for a row or column in that coefficient group; subsequently reconstructing transform coefficient levels for any non-zero coefficients in said row or column identified based on the reconstructed significant-coefficient flags of said row or column; and then repeating the reconstructing of significant-coefficient flags and the reconstructing of transform coefficient levels for subsequent rows or columns in the scan order until the transform coefficients in that coefficient group have been reconstructed.

In yet another aspect, the present application describes a method of decoding a bitstream of encoded video by reconstructing transform coefficients, wherein the bitstream includes a transform unit partitioned into columns and rows of block-based coefficient groups, wherein for each coefficient group the reconstruction proceeds in a scan order from a lower right corner of that coefficient group to an upper left corner of that coefficient group, and wherein the scan order within each coefficient group is either horizontal, vertical, or diagonal. The method includes, for each coefficient group from a last-significant-coefficient group to an upper-left coefficient group in a group scan order, reconstructing, in the scan order, transform coefficients of that coefficient group. The scan order within the upper-left coefficient group is diagonal, the scan order within the coefficient groups in the leftmost column of the transform unit, other than the upper-left coefficient group, is vertical, and the scan order within the coefficient groups in the uppermost row of the transform unit, other than the upper-left coefficient group, is horizontal.

In another aspect, the present application describes a method of reconstructing coefficient levels from a bitstream of encoded video data for a coefficient group in a transform unit, wherein the bitstream includes encoded significant-coefficient flags indicating non-zero coefficients in the coefficient group. The method includes setting a threshold based upon level information from one or more previously-reconstructed coefficient groups in the transform unit; decoding, in a scan order, level flags for the non-zero coefficients in the coefficient group unless the threshold number of decoded level flags is reached; decoding level data, if any, for non-zero coefficients in the coefficient group based upon the decoded level flags; and reconstructing the coefficient levels for the coefficient group from the decoded level data and the decoded level flags.

In a further aspect, the present application describes encoders and decoders configured to implement such methods of encoding and decoding.

In yet a further aspect, the present application describes non-transitory computer-readable media storing computer-executable program instructions which, when executed, configured a processor to perform the described methods of encoding and/or decoding.

Other aspects and features of the present application will be understood by those of ordinary skill in the art from a review of the following description of examples in conjunction with the accompanying figures.

In the description that follows, some example embodiments are described with reference to the H.264 standard for video coding and/or the developing HEVC standard. Those ordinarily skilled in the art will understand that the present application is not limited to H.264/AVC or HEVC but may be applicable to other video coding/decoding standards, including possible future standards, multi-view coding standards, scalable video coding standards, and reconfigurable video coding standards.

In the description that follows, when referring to video or images the terms frame, picture, slice, tile and rectangular slice group may be used somewhat interchangeably. Those of skill in the art will appreciate that, in the case of the H.264 standard, a frame may contain one or more slices. It will also be appreciated that certain encoding/decoding operations are performed on a frame-by-frame basis, some are performed on a slice-by-slice basis, some picture-by-picture, some tile-by-tile, and some by rectangular slice group, depending on the particular requirements or terminology of the applicable image or video coding standard. In any particular embodiment, the applicable image or video coding standard may determine whether the operations described below are performed in connection with frames and/or slices and/or pictures and/or tiles and/or rectangular slice groups, as the case may be. Accordingly, those ordinarily skilled in the art will understand, in light of the present disclosure, whether particular operations or processes described herein and particular references to frames, slices, pictures, tiles, rectangular slice groups are applicable to frames, slices, pictures, tiles, rectangular slice groups, or some or all of those for a given embodiment. This also applies to transform units, coding units, groups of coding units, etc., as will become apparent in light of the description below.

The present application describes example processes and devices for encoding and decoding transform coefficients of a transform unit. The non-zero coefficients are identified by a significance map. A significance map is a block, matrix, group, or set of flags that maps to, or corresponds to, a transform unit or a defined unit of coefficients (e.g. several transform units, a portion of a transform unit, or a coding unit). Each flag indicates whether the corresponding position in the transform unit or the specified unit contains a non-zero coefficient or not. In existing standards, these flags may be referred to as significant-coefficient flags. In existing standards, there is one flag per coefficient from the DC coefficient to the last significant coefficient in a scan order, and the flag is a bit that is zero if the corresponding coefficient is zero and is set to one if the corresponding coefficient is non-zero. The term "significance map" as used herein is intended to refer to a matrix or ordered set of significant-coefficient flags for a transform unit, as will be understood from the description below, or a defined unit of coefficients, which will be clear from the context of the applications.

Figure 2:
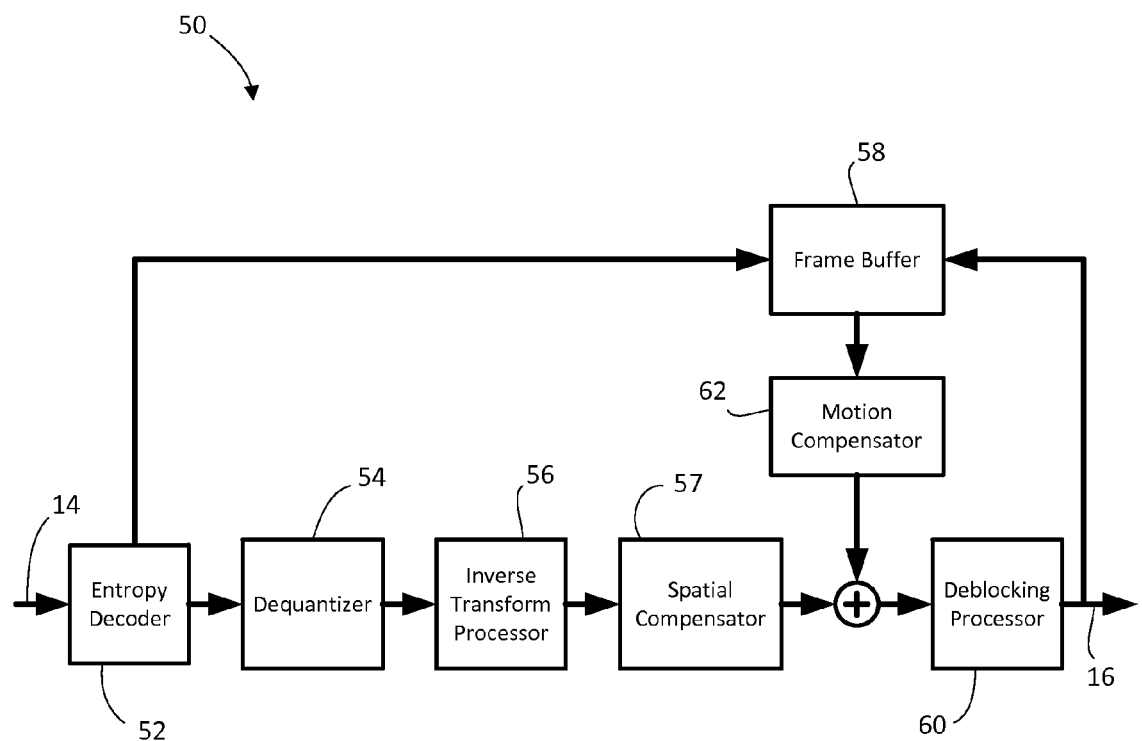
FIG. 2 shows, in block diagram form, a decoder for decoding video.

Reference is now made to FIG. 1, which shows, in block diagram form, an encoder 10 for encoding video. Reference is also made to FIG. 2, which shows a block diagram of a decoder 50 for decoding video. It will be appreciated that the encoder 10 and decoder 50 described herein may each be implemented on an application-specific or general purpose computing device, containing one or more processing elements and memory. The operations performed by the encoder 10 or decoder 50, as the case may be, may be implemented by way of application-specific integrated circuit, for example, or by way of stored program instructions executable by a general purpose processor. The device may include additional software, including, for example, an operating system for controlling basic device functions. The range of devices and platforms within which the encoder 10 or decoder 50 may be implemented will be appreciated by those ordinarily skilled in the art having regard to the following description.

The encoder 10 receives a video source 12 and produces an encoded bitstream 14. The decoder 50 receives the encoded bitstream 14 and outputs a decoded video frame 16. The encoder 10 and decoder 50 may be configured to operate in conformance with a number of video compression standards. For example, the encoder 10 and decoder 50 may be H.264/AVC compliant. In other embodiments, the encoder 10 and decoder 50 may conform to other video compression standards, including evolutions of the H.264/AVC standard, like HEVC.

The encoder 10 includes a spatial predictor 21, a coding mode selector 20, transform processor 22, quantizer 24, and entropy encoder 26. As will be appreciated by those ordinarily skilled in the art, the coding mode selector 20 determines the appropriate coding mode for the video source, for example whether the subject frame/slice is of I, P, or B type, and whether particular coding units (e.g. macroblocks, coding units, etc.) within the frame/slice are inter or intra coded. The transform processor 22 performs a transform upon the spatial domain data. In particular, the transform processor 22 applies a block-based transform to convert spatial domain data to spectral components. For example, in many embodiments a discrete cosine transform (DCT) is used. Other transforms, such as a discrete sine transform or others may be used in some instances. The block-based transform is performed on a coding unit, macroblock or sub-block basis, depending on the size of the macroblocks or coding units. In the H.264 standard, for example, a typical 16×16 macroblock contains sixteen 4×4 transform blocks and the DCT process is performed on the 4×4 blocks. In some cases, the transform blocks may be 8×8, meaning there are four transform blocks per macroblock. In yet other cases, the transform blocks may be other sizes. In some cases, a 16×16 macroblock may include a non-overlapping combination of 4×4 and 8×8 transform blocks.

Applying the block-based transform to a block of pixel data results in a set of transform domain coefficients. A "set" in this context is an ordered set in which the coefficients have coefficient positions. In some instances the set of transform domain coefficients may be considered as a "block" or matrix of coefficients. In the description herein the phrases a "set of transform domain coefficients" or a "block of transform domain coefficients" are used interchangeably and are meant to indicate an ordered set of transform domain coefficients.

The set of transform domain coefficients is quantized by the quantizer 24. The quantized coefficients and associated information are then encoded by the entropy encoder 26.

The block or matrix of quantized transform domain coefficients may be referred to herein as a "transform unit" (TU). In some cases, the TU may be non-square, e.g. a non-square quadrature transform (NSQT).

Intra-coded frames/slices (i.e. type I) are encoded without reference to other frames/slices. In other words, they do not employ temporal prediction. However intra-coded frames do rely upon spatial prediction within the frame/slice, as illustrated in FIG. 1 by the spatial predictor 21. That is, when encoding a particular block the data in the block may be compared to the data of nearby pixels within blocks already encoded for that frame/slice. Using a prediction algorithm, the source data of the block may be converted to residual data. The transform processor 22 then encodes the residual data. H.264, for example, prescribes nine spatial prediction modes for 4×4 transform blocks. In some embodiments, each of the nine modes may be used to independently process a block, and then rate-distortion optimization is used to select the best mode.

The H.264 standard also prescribes the use of motion prediction/compensation to take advantage of temporal prediction. Accordingly, the encoder 10 has a feedback loop that includes a de-quantizer 28, inverse transform processor 30, and deblocking processor 32. The deblocking processor 32 may include a deblocking processor and a filtering processor. These elements mirror the decoding process implemented by the decoder 50 to reproduce the frame/slice. A frame store 34 is used to store the reproduced frames. In this manner, the motion prediction is based on what will be the reconstructed frames at the decoder 50 and not on the original frames, which may differ from the reconstructed frames due to the lossy compression involved in encoding/decoding. A motion predictor 36 uses the frames/slices stored in the frame store 34 as source frames/slices for comparison to a current frame for the purpose of identifying similar blocks. Accordingly, for macroblocks or coding units to which motion prediction is applied, the "source data" which the transform processor 22 encodes is the residual data that comes out of the motion prediction process. For example, it may include information regarding the reference frame, a spatial displacement or "motion vector", and residual pixel data that represents the differences (if any) between the reference block and the current block. Information regarding the reference frame and/or motion vector may not be processed by the transform processor 22 and/or quantizer 24, but instead may be supplied to the entropy encoder 26 for encoding as part of the bitstream along with the quantized coefficients.

Those ordinarily skilled in the art will appreciate the details and possible variations for implementing video encoders.

The decoder 50 includes an entropy decoder 52, dequantizer 54, inverse transform processor 56, spatial compensator 57, and deblocking processor 60. The deblocking processor 60 may include deblocking and filtering processors. A frame buffer 58 supplies reconstructed frames for use by a motion compensator 62 in applying motion compensation. The spatial compensator 57 represents the operation of recovering the video data for a particular intra-coded block from a previously decoded block.

The bitstream 14 is received and decoded by the entropy decoder 52 to recover the quantized coefficients. Side information may also be recovered during the entropy decoding process, some of which may be supplied to the motion compensation loop for use in motion compensation, if applicable. For example, the entropy decoder 52 may recover motion vectors and/or reference frame information for inter-coded macroblocks.

The quantized coefficients are then dequantized by the dequantizer 54 to produce the transform domain coefficients, which are then subjected to an inverse transform by the inverse transform processor 56 to recreate the "video data". It will be appreciated that, in some cases, such as with an intra-coded macroblock or coding unit, the recreated "video data" is the residual data for use in spatial compensation relative to a previously decoded block within the frame. The spatial compensator 57 generates the video data from the residual data and pixel data from a previously decoded block. In other cases, such as inter-coded macroblocks or coding units, the recreated "video data" from the inverse transform processor 56 is the residual data for use in motion compensation relative to a reference block from a different frame. Both spatial and motion compensation may be referred to herein as "prediction operations".

The motion compensator 62 locates a reference block within the frame buffer 58 specified for a particular inter-coded macroblock or coding unit. It does so based on the reference frame information and motion vector specified for the inter-coded macroblock or coding unit. It then supplies the reference block pixel data for combination with the residual data to arrive at the reconstructed video data for that coding unit/macroblock.

A deblocking/filtering process may then be applied to a reconstructed frame/slice, as indicated by the deblocking processor 60. After deblocking/filtering, the frame/slice is output as the decoded video frame 16, for example for display on a display device. It will be understood that the video playback machine, such as a computer, set-top box, DVD or Blu-Ray player, and/or mobile handheld device, may buffer decoded frames in a memory prior to display on an output device.

It is expected that HEVC-compliant encoders and decoders will have many of these same or similar features.

Quantized Transform Domain Coefficient Encoding and Decoding

As noted above, the entropy coding of a block or set of quantized transform domain coefficients includes encoding the significance map (e.g. a set of significant-coefficient flags) for that block or set of quantized transform domain coefficients. The significance map is a binary mapping of the block indicating in which positions (from the last significant-coefficient position to the DC position in the upper-left corner) non-zero coefficients appear. The significance map may be converted to a vector in accordance with the scan order (which may be vertical, horizontal, diagonal, zig-zag, or any other scan order permitted under the applicable standard). The scan is typically done in "reverse" order, i.e. starting with the last significant coefficient and working back through the significant map in reverse direction until the significant-coefficient flag in the upper-left corner at [0,0] is reached. In the present description, the term "scan order" is intended to mean the order in which flags, coefficients, or groups, as the case may be, are processed and may include orders that are referred to colloquially as "reverse scan order".

Each significant-coefficient flag is then entropy encoded using the applicable context-adaptive coding scheme. For example, in many applications a context-adaptive binary arithmetic coding (CABAC) scheme may be used.

For 4×4 and 8×8 transform units, existing standards determine context based on the position of the significant-coefficient flag within the transform unit. With 16×16 and 32×32 significance maps, the context for a significant-coefficient flag is (in most cases) based upon neighboring significant-coefficient flag values. Among the contexts used for 16×16 and 32×32 significance maps, there may be a context dedicated to the DC bit position at [0,0] and (in some example implementations) to neighboring bit positions, but most of the significant-coefficient flags take one of a set of contexts that depend on the cumulative values of neighboring significant-coefficient flags. In these instances, the determination of the correct context for a significant-coefficient flag depends on determining and summing the values of the significant-coefficient flags at neighboring locations (typically five locations, but it could be more or fewer in some instances).

The levels for those non-zero coefficients may then be encoded. In one example implementation, the levels may be encoded by first encoding a map of those non-zero coefficients having an absolute value level greater than one. Another map may then be encoded of those non-zero coefficients having a level greater than two. The value or level of any of the coefficients having an absolute value greater than two is then encoded. In some cases, the value encoded may be the actual value minus three. The sign of each of the non-zero coefficients is also encoded. Each non-zero coefficient has a sign bit indicating whether the level of that non-zero coefficient is negative or positive, although sign bit hiding can be employed in some instances to reduce the number of sign bits.

Figure 3:
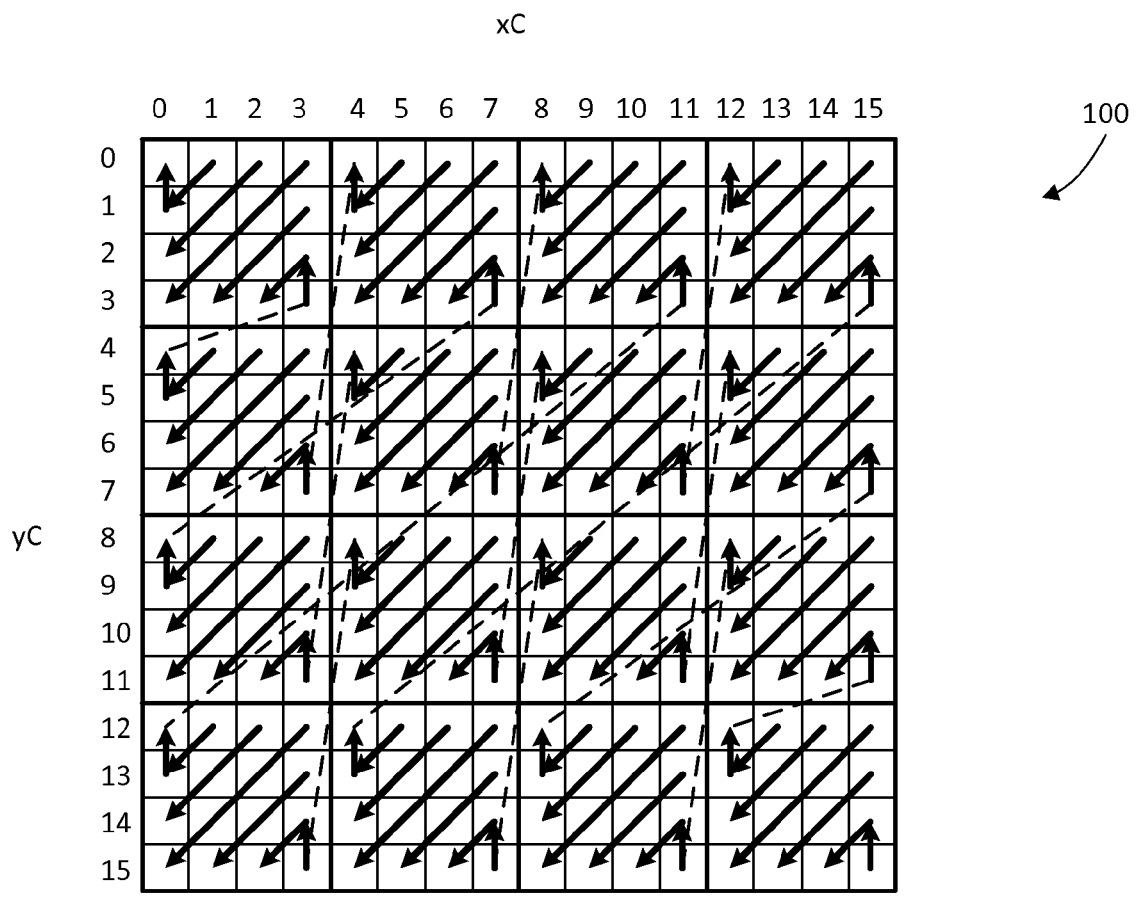
FIG. 3 shows, an example of a multi-level scan order for a 16×16 transform unit.

Some prior work has focused on using multi-level significance maps. Reference is now made to FIG. 3, which shows a 16×16 transform unit 100 with a multi-level diagonal scan order illustrated. The transform unit 100 is partitioned into sixteen contiguous 4×4 coefficient groups or "sets of significant-coefficient flags". Within each coefficient group, a diagonal scan order is applied within the group, rather than across the whole transform unit 100. The sets or coefficient groups themselves are processed in a scan order, which in this example implementation is also a diagonal scan order. It will be noted that the scan order in this example is illustrated in "reverse" scan order; that is, the scan order is shown starting from the bottom-right coefficient group in a downward-left diagonal direction and progressing towards the upper-left coefficient group. In some implementations the same scan order may be defined in the other direction; that is, progressing in an upwards-right diagonal direction and when applied during encoding or decoding may be applied in a "reverse" scan order.

The use of multi-level significance maps involves the encoding of an L1 or higher-level significance map that indicates which coefficient groups may be expected to contain non-zero significant-coefficient flags, and which coefficient groups contain all zero significant-coefficient flags. The coefficient groups that may be expected to contain non-zero significant-coefficient flags have their significant-coefficient flags encoded, whereas the coefficient groups that contain all zero significant-coefficient flags are not encoded (unless they are groups that are encoded because of a special case exception because they are presumed to contain at least one non-zero significant-coefficient flag). Each coefficient group has a significant-coefficient-group flag (unless a special case applies in which that coefficient group has a flag of a presumed value, such as the group containing the last significant coefficient, the upper left group, etc.).

As noted above, for 16×16 and 32×32 TUs, (as well as for other larger TU sizes), and for non-square TUs, a context model that may be used for encoding and decoding a significant-coefficient flag in position x is based on the significant-coefficient flags of nearby positions. In one example, the context model bases the context for the significant-coefficient flag in position x on the sum of significant-coefficient flags in a template of positions a, b, c, d, and e:

| x | a |   | d |
|---|---|---|---|
| c | b |   |   |
| e |   |   |   |

To the extent that the significant-coefficient flags a, b, c, d, or e fall outside the borders of the TU they are assumed to be zero. The above context definition assumes that x is not in the DC position [0, 0] within the transform unit, since a distinct context is used for encoding flags in that position. In some implementations, the transform unit is divided into two regions and a separate set of contexts is maintained for each of the regions. For example, the upper-left coefficient group may be a first region and the remaining coefficient groups a second region. Context in both regions is determined using the above-described template of neighboring or nearby significant-coefficient flags, although the separate context sets are used in the two regions.

Context for encoding levels is largely based upon a count of level parameters in previously-processed coefficient groups. For example, when encoding greater-than-one flags for a coefficient groups, the context may be determined based upon the number of greater-than-one flags in the previously-encoded coefficient group.

Scan Order Dependent Templates

Current work on HEVC is focused on using a diagonal scan order within coefficient groups (i.e. the coefficient scan order) and as-between coefficient groups (i.e. the group level scan order). This is illustrated in FIG. 3.

One of the problems encountered in using the current context template and diagonal scan order is that there are throughput problems at the upper-left corner and bottom-right corner of every coefficient group. FIG. 4 illustrates the scan order in a 4×4 coefficient group starting from position "0" and moving to position "15". The encoding or decoding of a significant-coefficient flag, for example, in a binary arithmetic coding (BAC) engine involves three steps or operations to complete. First, the context is determined, then the symbol is decoded, and then the context is updated. If the next symbol to be decoded has a context that relies upon the current symbol and requires the context update, then the decoder must wait until the current symbol has completed processing in the BAC engine before decoding of the next symbol can begin. Accordingly, pipelining in the case of a context template is only possible if the neighboring flags in the template are already out of the BAC engine. The context template currently used means that in a diagonal scan order the significant-coefficient flags in positions 1, 2, 3, 4, 13, 14, and 15, will all encounter pipelining problems. If a horizontal or vertical scan order were used with the context template depicted above, then pipelining problems arise in every position (except 0, since the template is entirely outside the coefficient group and presumed to be all zeros).

The present application, in one aspect, proposes use of distinct context templates specific to horizontal and vertical scan orders. The templates are structured to ensure that the neighboring or nearby positions specified in the template are all at least three scan order positions previous to the current position in the scan order, thereby ensuring that all data required has been fully processed by the BAC engine.

Reference is now made to FIG. 5, which illustrates a first example of a horizontal context template 120. The horizontal context template 120 is for determining context for encoding a symbol at position 'x' 122 in a coefficient group 130. The location of 'x' illustrated in FIG. 5 is an example location; it will be understood that the template may be used to determine the context for 'x' 122 at any other position within the coefficient group 130. The horizontal template 120 includes elements a, b, c, and d (indicated by 124a, 124b, 124c, and 124d, respectively). In some cases, the context of 'x' 122 will be based upon a sum of elements, such as significant-coefficient flags, in the position of elements a, b, c, and d. In some cases, the determination may involve calculating the sum subject to maximum value and using that calculated value to index a context set.

It will be noted that the horizontal context template 120, when used with a horizontal scan order in a 4×4 coefficient group, ensures that the symbol for which context is to be determined, i.e. symbol 'x' 122, is at least three scan order positions subsequent to the neighboring or nearby symbols in the template, i.e. a, b, c, d.

FIG. 6 illustrates another example horizontal template 140. In this example, the neighboring or nearby symbols are reduced to a, b, and c.

FIG. 7 illustrates yet another example horizontal template 150. In this example, four neighboring or nearby symbols, a, b, c and d, are used but are arranged unsymmetrically with respect to 'x'. This arrangement ensures that there are at least four scan order positions from symbol 'x' to the neighboring or nearby symbols in the template 150, in the case of horizontal scan order in a 4×4 coefficient group. In at least one variation, position 'd' may be omitted from the template.

Figure 8:
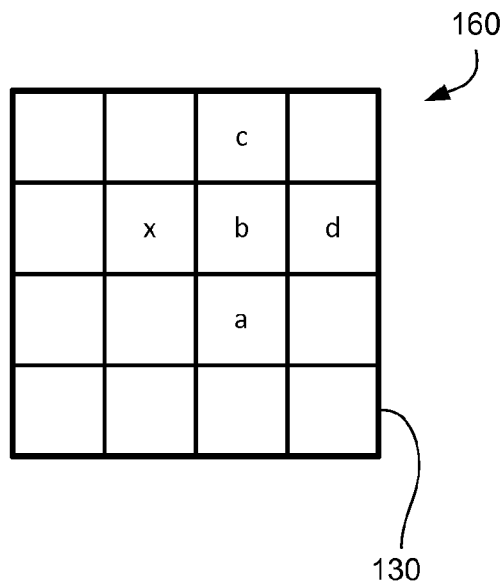
Figure 9:
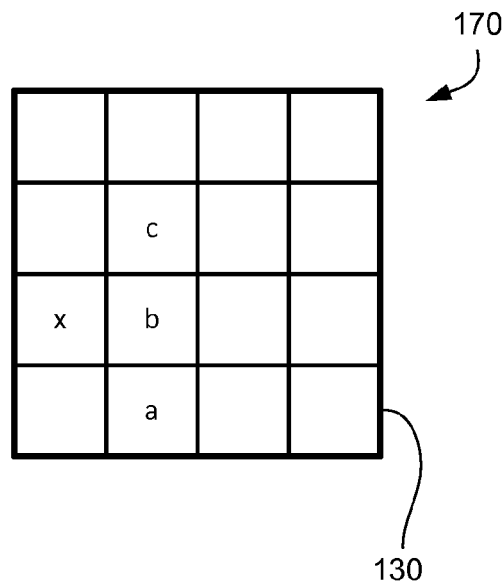
Figure 10:
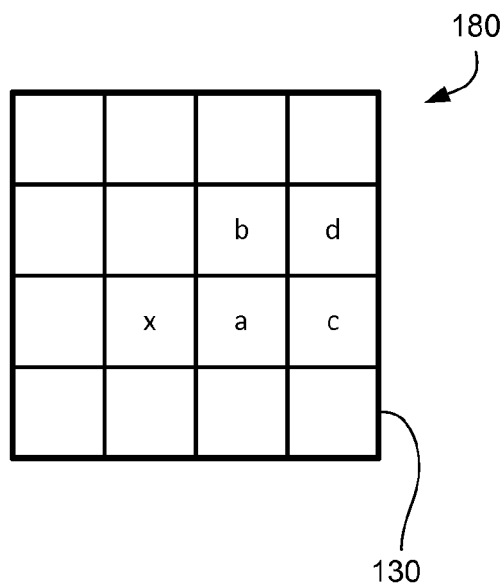

Reference is now made to FIG. 8, which illustrates a first example of a vertical context template 160. The vertical context template 160 has substantially the same structure as the horizontal context template 140, but turned counter-clockwise for implementation with a vertical scan order. FIG. 9 shows another example embodiment of a vertical context template 170 and FIG. 10 shows yet a further example embodiment of a vertical context template 180.

As noted above, the horizontal context templates described above are intended to be used in connection with a horizontal scan order within a coefficient group. The vertical context templates described above are intended to be used in connection with a vertical scan order within a coefficient group. In general, the scan-order-dependent templates may be structured to use any elements that are at least three scan-order positions previous to the element for which context is being determined.

In one example embodiment, the horizontal and vertical context templates are used for determining context for the encoding of significant-coefficient flags in a coefficient group when horizontal or vertical scan orders are used, as the case may be. The diagonal context template described above may be used when encoding significant-coefficient flags using a diagonal scan order.

In another aspect of the present application, the template-based context determination is extended to small TU sizes, such as 8×8 and, in some embodiments, 4×4 TUs.

In yet another embodiment, when using diagonal scan in particular, the following template may be used for context determination:

| x | a | b | c |
|---|---|---|---|
| d | e |   |   |
| f |   |   |   |
| g |   |   |   | where 'x' indicates the coefficient element for which context is being determined. In one example, this template is used for context determination in 8×8 TUs when using diagonal scan order.

Context Determination for Coefficient Level Encoding and Decoding

In some video encoding or decoding processes, the coefficient level coding and decoding is done in stages. That is, the coefficient coding process includes encoding a significance map that identifies all non-zero coefficients. The level coding is done by identifying which of the non-zero coefficients have a level greater than one. Of those coefficients that are greater than one, the coefficients that have a level greater than two are then identified. Of those coefficients, those that have a level greater than three then have their actual level encoded/decoded. With the latter set of coefficients, rather than encoding the absolute level, the magnitude-less-three may be encoded (since it is known that the level is greater than two), and the decoder adds three to these decoded levels.

Context level coding and decoding is typically done in sets or groups of 16 coefficients. This corresponds well with the block-based coefficient group encoding and decoding of the significance map, and the multi-level scan order used in that process.

Like the encoding of the significance map, the encoding of the coefficient levels (greater-than-one, greater-than-two, and absolute-value-less-three), relies upon context modeling. In some implementations, the context set used for encoding coefficient levels in a set of 16 levels, e.g. a coefficient group, is dependent upon the previous set of coefficient levels processed, e.g. the previous coefficient group in scan order. The magnitudes of the coefficients in the previously processed scan set are used to determine which context set to use on the basis that the magnitudes of the coefficients in the previous set are correlated to the expected magnitudes of the coefficients in the current set.

When multi-level scan orders are used it is possible for situations to arise in which the previous coefficient group in group-level scan order is not a nearby group. For example, the previous coefficient group in the reverse group-level scan order may be located at the other side of the transform unit. It will be appreciated that the magnitude of the coefficients in one of those coefficient groups is not necessarily well correlated with the magnitude of the coefficients in the other of those coefficient groups.

In accordance with one aspect of the present application, context for encoding or decoding coefficient levels is based upon context templates. In one example, the context template includes significant-coefficient flag elements. In another example, the context template includes significant-coefficient flag elements from elements subsequent to the current level element in the scan order, i.e. to the left and/or above the current level element in the coefficient group.

In current decoders, the significance map of a coefficient group is fully decoded before the level information (the greater-than-one flags, greater-than-two flags, and the magnitude data). Accordingly, the present application proposes to use the significance map in determining context for transform coefficient level encoding and decoding. Even in an embodiment described below, in which significance map and level information decoding is interleaved on a scan-line basis within the coefficient group, the significance map information from the same line is available for use in context determination for level decoding.

In one embodiment, where the significance map of a coefficient group is encoded/decoded before encoding/decoding of the level information, the level information may be encoded/decoded using any of the prescribed scan orders, including horizontal, vertical, diagonal, or zig-zag, irrespective of which scan order was used for encoding/decoding of the significance map. That is, the coefficient-level scan order within the coefficient group may be different for the significance map and the level information in some embodiments.

Figure 11:
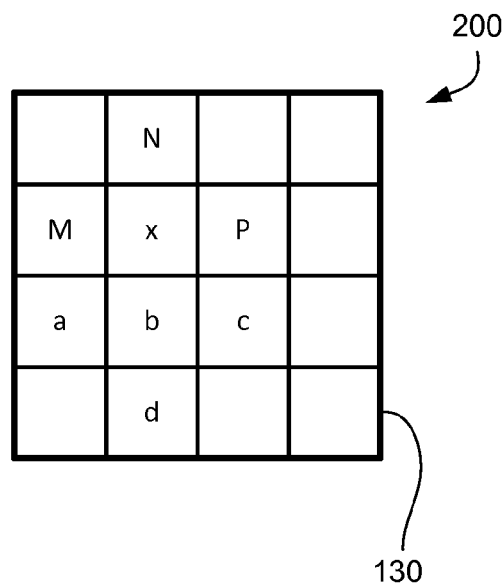

Reference is now made to FIG. 11, which shows an example horizontal context template 200 for determining context to encode a level element in a coefficient group 130. The horizontal context template 200 is intended for use with a horizontal scan order within the coefficient group 130.

The horizontal context template 200 may be used for determining context for encoding greater-than-one flags, by way of example. In this example, the neighboring or nearby symbols a, b, c, and d, are previously processed greater-than-one flags. If those neighboring or nearby greater-than-one flags fall outside the coefficient group 130 they may be presumed to be zero. In this example, there may be 4 contexts (indexed as 0, 1, 2 and 3) selected based on the sum of the neighboring or nearby greater-than-one flags and subject to a maximum. There may further be multiple context sets that are selected based on neighboring or nearby significant-coefficient flags M, N, and P. In this embodiment, the neighboring or nearby significant-coefficient flags M, N, and P in the template may be used to select a context set. For example, three different context sets may be defined, each context set containing the four contexts selected using the greater-than-one flags a, b, c, and d. Accordingly, context determination using this example horizontal context template 200 may be expressed as:

$$\text{context\_set} = \min(2, M+N+P)$$

$$\text{context} = \text{context\_set}*4 + \min(3, a+b+c+d)$$

To the extent that the neighboring or nearby significant-coefficient flags M, N or P fall outside the coefficient group, they may be presumed to be zero in some embodiments.

In one embodiment, decoding of level information may be fully interleaved on a position-by-position basis. In other words, the full level information of preceding transform coefficients (possibly excluding the sign in some cases) is decoded and available when processing a current position in the scan order. As such, neighboring or nearby symbols a, b, c and d in FIG. 11 may refer to the absolute values of the transform coefficients (levels) in those locations. In such an embodiment, the context derivation for encoding/decoding a current level in position 'x' may be expressed as:

$$\text{context} = \text{context\_set}*4 + \min(3, f(a)+f(b)+f(c)+f(d)),$$

where $f(n)=0$ if $n=0$, and
$n-1$ if $n>0$,
and where a, b, c, and d are the absolute values of the coefficient levels in those positions.

In another embodiment, the context may be determined from a sum of the significant-coefficient flags and greater-than-one flags at positions a, b, c, d, M, N, and P. In other embodiments, different neighboring or nearby greater-than-one flags and/or significant-coefficient flags may be incorporated into the context determination. In one example, the significant-coefficient flags used in context set selection may include flags in the position of symbol 'x', in position a, position b, and/or position c.

It will be noted that the greater-than-one flags used in the present example correspond to the horizontal context template described above in connection with FIG. 5, thereby permitting pipelining advantages in some implementations (keeping in mind, however, than not all positions within the coefficient group necessarily have greater-than-one flags, which may result in anomalous BAC engine stalls dependent on the pattern of greater-than-one flags within the coefficient group).

In yet another embodiment, the example horizontal context template 200 may be applied to determine context for encoding and decoding greater-than-two flags, in which case the positions a, b, c, and d in the template may refer to greater-than-two flags and the positions M, N, and P may refer to greater-than-one flags. In another embodiment, when used for greater-than-two flags, the context template may include significant-coefficient flags, either in addition to or instead of other elements like greater-than-one flags and greater-than-two flags. Other variations in the multi-level context templates will be appreciated having regard to the description herein.

In general any previously encoded/decoded elements may be used in multi-level template-based context determination. It will be appreciated that the specific multi-level context template illustrated in FIG. 11 is not limiting and that other templates may use elements in other positions for determining context for encoding level parameters. The example of three context sets and four contexts in each set is illustrative and other embodiments may have more or fewer context sets and more or fewer contexts in each set.

Figures 12, 13, 14, 15:
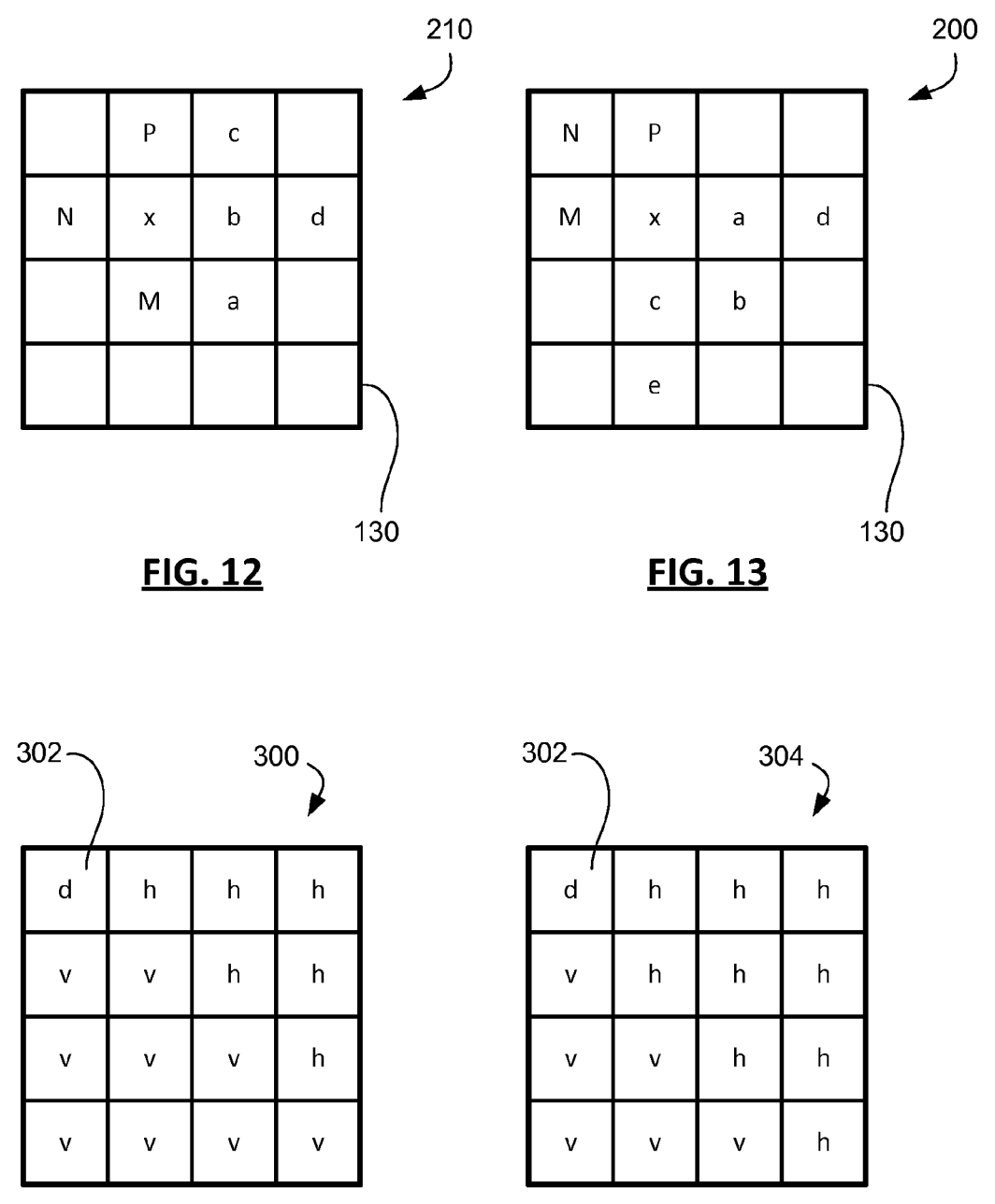

Reference is now made to FIG. 12, which shows an example of a vertical context template 210 for determining context for encoding level information. The vertical context template 210 corresponds in design to the horizontal context template 200 (FIG. 11). The vertical context template 210 is intended for use in conjunction with vertical scan order within a coefficient group.

FIG. 13 illustrates an example of a diagonal context template 220 for determining context for encoding level information. The diagonal context template 220 is intended for use in conjunction with diagonal scan order within a coefficient group.

Multiple Scan Orders within a Transform Unit

As noted above, the diagonal scan order within coefficient groups poses pipelining problems when template-based context determination is employed. In one aspect, the present application describes encoding and decoding processes in which multiple scan orders may be applied at the coefficient level, i.e. within coefficient groups of a transform unit.

In one embodiment, the diagonal sub-block scan order (i.e. coefficient group scan order) is maintained such that coefficient groups are processed in diagonal scan order. The last significant coefficient is located within the coefficient groups using diagonal scan order and the coefficient group containing the last significant coefficient is processed using diagonal scan order.

All other coefficient groups are then processed using either horizontal, vertical or diagonal scan order. The selected scan order(s) may be specified in a picture header, for example. The selected scan order may be all horizontal, for example. In another example, the selected scan order may be all vertical or all horizontal except for the last significant coefficient group and the DC coefficient group, which are both processed using diagonal scan order.

In another embodiment, the scan order within all coefficient groups except the DC coefficient group is either horizontal or vertical. The determination of whether a coefficient group uses horizontal or vertical may, in some embodiments, be based upon the geometric position of that coefficient group within the transform unit. Examples are described below.

In a first example, the selection of a scan order may be based upon the x- and y-coordinates of the coefficient group within the transform unit. Reference is made to FIG. 14, which illustrates the first example embodiment in which the decision condition is $X \leq Y$. In FIG. 14, an example 16×16 transform unit 300 is divided into sixteen 4×4 coefficient groups. The coefficient groups are processed in diagonal scan order at the group level, i.e. diagonal scan order is used to move from coefficient group to coefficient group. Within coefficient groups, those groups for which $X \leq Y$ use vertical scan order, and horizontal scan order otherwise. Each group that uses vertical scan order is indicated with reference letter 'v' and each group that uses horizontal scan order is indicated with reference letter 'h'. In this example embodiment, as an exception the DC group 302 uses diagonal scan order. In another example embodiment, the coefficient group containing the last significant coefficient also uses diagonal scan order.

Another example embodiment is illustrated in FIG. 15. In FIG. 15, the example 16×16 transform unit 304 is divided into sixteen 4×4 coefficient groups, and the coefficient groups are processed in diagonal scan order at the group level. Within the coefficient groups, with the exception of the DC coefficient group, the groups for which $X<Y$ use vertical scan order, and horizontal scan order otherwise. Again, the DC coefficient group uses diagonal scan order in this example.

Reference is now made to FIG. 16, which illustrates yet a further embodiment of a multi-scan-order encoding and decoding process. In this example, the DC coefficient group uses a diagonal scan, the top row of coefficient groups uses a horizontal scan and the leftmost column of coefficient groups uses a vertical scan. The remaining coefficient groups may use horizontal or vertical scan order. In one example, the remaining coefficient groups use all horizontal scan order. In another example, the remaining coefficient groups use all vertical scan order. In yet another example, the remaining coefficient groups use a combination of horizontal and vertical scan orders in a pattern, such as checkerboard.

The use of horizontal scan in the top row and vertical scan in the leftmost column may be advantageous as a result of residuals tending to be slightly directional. The prediction process typically smoothes out strong edges, if any, but the process is not perfect, which results in directional residuals. Secondly, in the transform domain after DCT, energy is often concentrated in the lower frequency areas of the transform unit. When residuals are directional, the energy is typically concentrated in either the first one or two rows or the first one or two columns. Based on this observation, the foregoing examples propose use of horizontal scan in the top row and vertical scan in the leftmost column.

In yet a further embodiment, diagonal-based scan order within coefficient groups is eliminated altogether for at least some transform units. That is, for those transform units the scan orders used within coefficient groups are either horizontal or vertical.

For cases in which the coefficient group contains a single bin that is the last significant-coefficient, the encoding performance of using horizontal or vertical (both may be tested to determine which is better) may be an improvement over diagonal. FIG. 17 shows the minimum number of coefficients to be encoded (e.g. as a significance map) from any given position back to the upper-left position using the best of either horizontal or vertical scan order under those conditions. FIG. 18 shows the minimum number of coefficients to be encoded from any given position back to the upper-left position using diagonal scan order under the same conditions. It will be noted that under these constraints the best of horizontal or vertical is at least as good, or better than, diagonal in all cases except one. In many cases, the horizontal or vertical coding is significantly better. It will be appreciated that these advantages do not necessarily hold if there are multiple bins in the coefficient group depending upon their layout.

The selection of horizontal or vertical for a particular coefficient group or transform unit may be signaled in the bitstream. For example, at the transform unit level, the position of the last significant coefficient within its coefficient group may be evaluated and horizontal or vertical scan order selected based on which would realize the best encoding performance. In some cases, horizontal scan order and vertical scan order may be used in coding mode selection to determine which results in the best performance, which may be measured by which results in the fewest number of significant-coefficient flags (i.e. the most compact significance map), for example. The selection is signaled with a bit that indicates either horizontal or vertical scan.

The resulting selection may be applied to all coefficient groups in the transform unit in some embodiments. In another embodiment, the selection may be applied to the coefficient group containing the last significant coefficient and the remaining coefficient groups use a predetermined scan order. For example, the remaining coefficient groups may use the scan orders indicated in any of FIG. 14, 15, or 16.

In yet another embodiment, to save encoding time the transform unit is not necessarily scanned with both horizontal and vertical scan orders to determine which to select. Rather, the first coefficient group (the DC coefficient group) is scanned with either the horizontal scan order or the vertical scan order. If the last significant coefficient is located in the first coefficient group, then it is scanned with the other of the horizontal or vertical scan orders and the encoder selects between the horizontal and vertical scan order based upon which yields the most compact significance map (i.e. the fewest number of significant-coefficient flags). The selected scan order is signaled in the bitstream. If the last significant coefficient does not appear in the DC coefficient group, then the encoder uses one of the scan orders and signals which one is being used in the bitstream.

As described in some of the embodiments above, the scan order used to locate the last significant-coefficient may be different from the scan order used to encode or decode the transform coefficients. In one example embodiment, the last significant-coefficient position may be determined by one of the following scan orders: horizontal, vertical, diagonal, or zig-zag, or any other scan order permitted under the applicable standard. The transform coefficients, however, are encoded and decoded using only the diagonal scan order (or some other preselected scan order).

Figure 24:
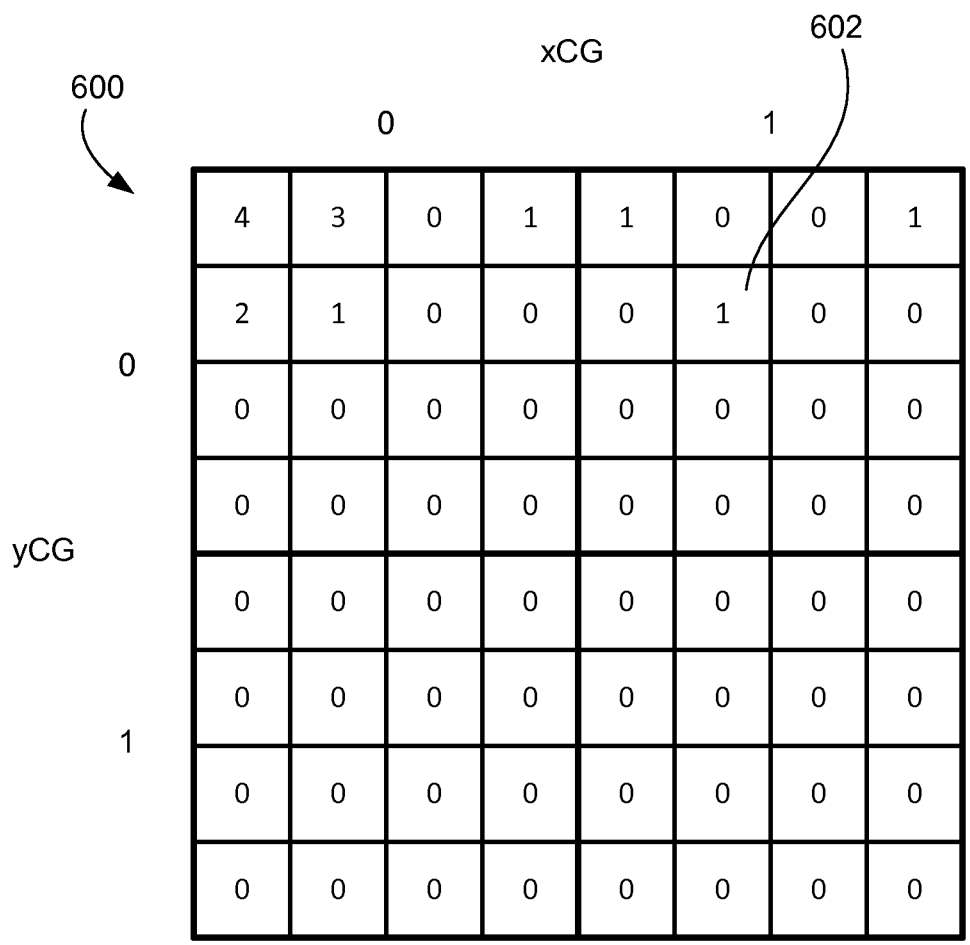
FIG. 24 shows an example 8×8 transform unit.

To illustrate by way example, reference is made to FIG. 24, which shows an example of an 8×8 transform unit 600. If horizontal scan is used to identify the last significant coefficient position, then position 602 is designated as the last significant-coefficient position. Diagonal scan order is used within the 4×4 coefficient groups to encode the significance map and other level information. The diagonal sub-block (coefficient group) scan with a diagonal group-level scan order (i.e. CG[1,1], CG[1,0], CG[0,1], CG[0,0]) results in the following vector:

```
0 0 0 0 0 0 0 0 0 0 0 0 0 0 0 0
0 0 0 0 0 1 0 0 0 0 1 0 0 0 1
0 0 0 0 0 0 0 0 0 0 0 0 0 0 0 0
0 0 0 0 0 0 1 0 0 0 0 1 0 3 2 4
```

The last significant-coefficient position 602 is the second 1 in the second line above.

Since the scan order used to determine the last significant-coefficient position is different from that used in the process of encoding or decoding the significance map and the coefficient levels, the information about the relative position of a coefficient at position (x, y) against the last significant-coefficient position in horizontal scan may be used to improve compression efficiency. For example, 1. if (y, x) appears after the last significant position (last_y, last_x) (e.g. (1, 5) in this example), in the horizontal scan, then the coefficient at (y, x) is inferred to be zero;
2. if (y, x) is equal to (last_y, last_x), then the significant-coefficient flag at (y, x) is inferred to be one, and the coefficient level at (y, x) needs to be decoded using the sub-block diagonal scan;
3. otherwise, the significant-coefficient flag and the coefficient level at (y, x) need to be decoded by using the sub-block diagonal scan.

In addition, the last significant-coefficient position in horizontal scan (last_y, last_x) can be used to improve compression efficiency of coding significant-coefficient-group flags. Let (cg_y, cg_x) denote the position of a coefficient group (determined by the position of the top-left coefficient in the coefficient group). Then 1. if (cg_y, cg_x) appears after the last significant position (last_y, last_x), that is (1, 5) in this case, in the horizontal scan, then the significant coefficient group flag is inferred to be zero;
2. if (cg_y>>2, cg_x>>2) is equal to (last_y>>2, last_x>>2) or (cg_y, cg_x) is equal to (0, 0), then the significant coefficient group flag at (y, x) is inferred to be one;
3. otherwise, the significant coefficient group flag needs to be decoded.

When multiple scan orders are used in a transform unit, an iterative minimization process can be used for RDOQ (rate distortion optimized quantization). For example, if one scan order is used to determine the last significant-coefficient position, and a different scan order is used to encode the significance map and the coefficient levels as described above, one can use the following iterative process for RDOQ:

1. Initialize a last significant-coefficient position (e.g. according to traditional scalar quantization).
2. Given the last significant-coefficient position, determine the significance map and the coefficient levels that minimize (or reduce) the rate distortion cost.
3. Given the significance map and the coefficient levels from Step 2, determine the last significant position that minimizes (or reduces) the rate distortion cost.
4. Repeat Steps 2 and 3 above until convergence or a stopping criterion is met (e.g. the number of iterations).

Similar ideas can be applied to other scenarios involving different scan orders in a TU.

Line-Based Interleaved Encoding

The present work on HEVC interleaves significance map coding and level coding by coefficient group. That is, the significance map of a coefficient group is encoded/decoded and then the level information corresponding to that significance map is encoded/decoded. An alternative suggestion is to interleave the significant-coefficient flag and level coding on a position-by-position basis. This would fully interleave the coding, but results in a bitstream that severely limits throughput.

Accordingly, in one aspect, the present application proposes the interleaving of significance map coding and coefficient level coding scan-line by scan-line. Advantageously, this still permits the use of many of the context templates described herein to realize pipelining.

The use of scan-line-based interleaved coding may be gracefully implemented in the case of horizontal or vertical scan orders through basing a "for" loop around the value of the y or x position index. For example, in the case of vertical scan order a scan-line will be all those positions within the coefficient group for a given value of x. In the case of diagonal scan, the scan-lines may be tracked based upon x+y (which ranges from 0, 1, 2, ..., 6).

Reference is now made to FIG. 19, which illustrates an example context template 310 for use with a horizontal scan order and scan-line-based interleaving. The context template 310 is similar to the horizontal context template 200 shown in FIG. 11, but excludes an element from the position above the 'x' position for which context is being determined. This allows the context template 310 to be used in scan-line-based interleaving since, when decoding the greater-than-one flags, for example, the significant-coefficient flags for the full line containing positions M and N are available.

With scan-line-based interleaving and either horizontal or vertical scan order, the bitstream structure encoding a 4×4 coefficient group includes four significant-coefficient flags, followed by up-to-four sets of level information (greater-than-one flag, greater-than-two flag, magnitude-minus-three, and sign bit). In cases where the four significant-coefficient flags are all zero, it will be appreciated that no level information will follow that set of significant-coefficient flags.

It will also be appreciated that with scan-line-based interleaving, the full transform coefficient information at positions a, b, c, and d (and indeed, anywhere in the previous scan lines) is available for context determination for encoding/decoding of significant-coefficient flags, greater-than-one flags, greater-than-two flags, or other level information in the current scan line, i.e. at position 'x' in the context template 310.

Adaptive Bypass Triggering in Level Coding

As described above, level coding is often based upon coding maps or flags. For example, significant-coefficient-flags may signal which coefficients of a coefficient group are non-zero. Greater-than-one flags may then signal which non-zero coefficients have a level greater-than-one, i.e. which ones are "greater-than-one coefficients". Greater-than-two flags may then be used to signal which of the greater-than-one coefficients have a level greater-than-two, i.e. which ones are "greater-than-two coefficients". Finally, for any greater-than-two coefficients the actual level-minus-three is encoded.

Based on probabilities, at a certain point it makes sense to cease encoding level flags and simply encode the level data regarding the absolute value of the level (less one or two, depending on which flags are still in use). Some video coding processes, for example the current draft of HEVC, prescribe one or more fixed thresholds at which the encoder and decoder stop using greater-than-one and greater-than-two flags. This is sometimes referred to as triggering a bypass operation or process, since the encoder and decoder thereafter skip the encoding/decoding of one or more level flags for that coefficient group. In another sense, it changes the meaning of the level data being encoded. When flags are in use, any encoded level data is the absolute value of the level less whatever baseline value the flags imply. If one or more of the level flags are no longer being used at some point in the coefficient group, then the encoded level data for a coefficient is the absolute value of the level less whatever baseline value the remaining flags (like the significant-coefficient flag) imply.

In one example, the maximum number of greater-than-one flags that will be encoded/decoded in a coefficient group may be fixed at eight, and the maximum number of greater-than-two flags that will be encoded/decoded in each coefficient group is one. In other words, a greater-than-one flag will be encoded/decoded for only up to 8 non-zero transform coefficients (in reverse scan order). Once eight greater-than-one flags have been encoded or decoded, then thereafter only level data for any further non-zero coefficients is encoded. Similarly, only one greater-than-two flag is encoded or decoded for a non-zero coefficient with its greater-than-one flag=1, in each coefficient group. Thereafter, only greater-than-one flags (presuming the threshold of 8 has not been reached) and remaining level data is encoded and decoded. It will be appreciated that the remaining level data that is encoded and decode depends on whether either of the thresholds has been met. If no further greater-than-two flags are being encoded, but greater-than-one flags are still being used, then the remaining level data will be the absolute value of the level minus two. If no further greater-than-one flags are being encoded then the remaining level data will be the absolute value of the level minus one. The remaining level data may be encoded using, for example, Golomb-Rice coding.

In accordance with one aspect of the present application, the encoder and decoder dynamically adjust the thresholds for determining when to cease encoding level flags on a coefficient group by coefficient group basis. In particular, the thresholds are set for each coefficient group using information derived from neighboring coefficient groups. It will be appreciated that this alternative is more adaptive, intelligently setting the thresholds according to the properties of the neighborhood around the coefficient group being encoded/decoded, thus allowing a savings in terms of context coded bins at little or no cost in terms of coding efficiency.

In one example embodiment, one or more of the thresholds is set depending upon level information from one or more previously encoded/decoded coefficient groups. For example the level information may relate to coefficient levels in one or more adjacent or neighboring coefficient groups. Level information may include absolute value of non-zero coefficient levels in previous coefficient groups in the group scan order. For example, the threshold may be set based upon the average absolute value of the coefficient levels of one or more neighboring coefficient groups. In another example, the level information may be the average or median absolute value of the non-zero coefficient levels in one or more neighboring coefficient groups. In yet another example, the level information may include a count of non-zero coefficients in one or more neighboring coefficient groups, i.e. the number of significant-coefficient flags that are equal to 1. In yet a further example, the level information may include a count of greater-than-one flags, a count of greater-than-one flags that are equal to 1, a count of greater-than-two flags, or a count of greater-than-two flags that are equal to 1. Various combinations of these types of level information may alternatively be used as the basis for setting the threshold(s).

In another example embodiment, the threshold may be set depending upon weighted level information from one or more previously encoded/decoded coefficient groups. That is, level information may be weighted based on the type of level information and/or based upon which of the neighboring coefficient groups it came from.

Figure 22:
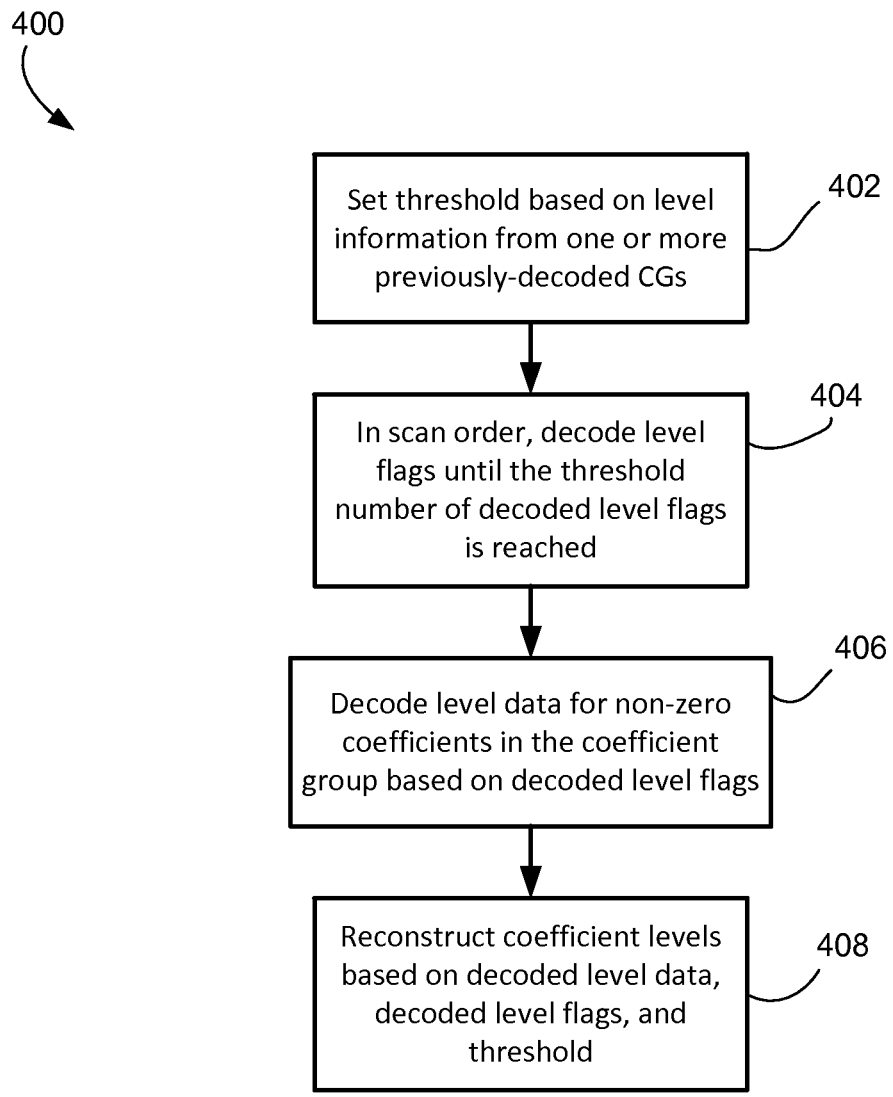
FIG. 22 shows an example method of reconstructing coefficient levels using adaptive-threshold-based level decoding.

Reference is now made to FIG. 22, which shows, in flowchart form, an example method 400 for reconstructing coefficient levels in a video decoder. From the description below, it will be appreciated that a similar process of determining the threshold(s) is applied at the encoder when encoding the bitstream of video.

The method 400 is applied in the case of decoding a bitstream of encoded video in which level flags are used to signal level information regarding non-zero coefficients, and in which remaining level data is used to communicate absolute value of levels in circumstances where the absolute value of the coefficient level is not directly signaled by the level flags for that coefficient. In one example, the level flags include greater-than-one flags and greater-than-two flags, and the remaining level data includes a level-remaining integer. As described above, the meaning of the level-remaining integer may change based upon whether the threshold has been met for encoding of one or more of the level flags. For illustrative simplicity, the method 400 presumes a single threshold.

In operation 402, the decoder sets the threshold based upon level information from one or more previously-decoded coefficient groups. In one example, the previously-decoded coefficient groups may include the coefficient groups to the right and below the current coefficient group. In another example, it may also include the coefficient group diagonally to the bottom-right of the current coefficient group. Other selections may be made dependent upon the implementation. For example, a non-square rectangular coefficient group may rely upon level information from a previously-decoded coefficient group with which it shares a long side.

As described above, the level information includes some level-related data that tends to indicate or impact the probability associated with levels in the current coefficient group. As one example, given a coefficient group i, let gt1_R and gt1_L denote the number of transform coefficients that are greater than 1 in the right and lower neighboring coefficient groups, respectively. If the right and/or lower neighboring coefficient groups fall outside the boundary of the transform unit, gt1_R and/or gt1_L are presumed to be 0, respectively. Let the threshold be M1_i, which denotes the maximum number of greater-than-1 flags that are encoded/decoded in the given coefficient group. In one example embodiment, M1_i=2 if gt1_R+gt1_L>1, and M1_i=8 otherwise.

In another embodiment, the bottom-right diagonal neighboring coefficient group is considered as well. Let gt1_D denote the number of transform coefficients that are greater than 1 in the bottom-right diagonal neighboring coefficient group. Then, the threshold M1_i=t1_0 if:

a1_R*gt1_R+a1_L*gt1_L+a1 D*gt1_D>t1, and

M1_i=t1_1 otherwise, where a1_X are weights, t1 is a switching condition value and t1_X<=8

In one specific example, a1_R=a1_L=1, a1_D=0, t1=1, t1_0=4, and t1_1=8. Note that this weighting removes the diagonal coefficient group from the equation. The weights and other conditionals may be signaled by the encoder to the decoder in a header at the video, frame, picture, slice, or transform unit levels, depending on the granularity of control desired.

In another embodiment, the number of greater-than-two coefficients is used instead of the number of greater-than-one coefficients. In another embodiment, the actual coefficient values are used instead of the number of greater-than-1 coefficients. Note that the foregoing examples refer to the number of "greater-than-one" coefficients and/or number of "greater-than-two" coefficients, which is not necessarily the same as the number of greater-than-one flags or number of greater-than-two flags, respectively. In some cases flags may be used instead of a count of number of coefficients having a level greater than one, two or whatever other condition may be selected.

In general, M1_i is determined using some function of the level information in any previously coded/decoded coefficient groups. For example, M1_i may be determined using a linear combination of the significant-coefficient flags, greater-than-1 flags, greater-than-2 flags and actual coefficient values in any previously coded/decoded groups.

Referring still to FIG. 22, in operation 404, the decoder decodes level flags (if any) for any non-zero coefficients in the coefficient group, subject to the threshold calculated in operation 402. For example, the decoder may decoder greater-than-one flags until the threshold number of greater-than-one flags is reached.

In operation 406, the decoder decodes the remaining level data, if any, for non-zero coefficients of the coefficient group. In some cases, there may be no remaining level data if the decoded flags so indicate. The meaning of the decoded remaining level data, if any, is dependent upon whether the threshold was reached in operation 404. Accordingly, in operation 408, the decoder reconstructs the coefficient levels for the coefficient group based upon the decoded level flags, the decoded remaining level data (if any), and the threshold set in operation 402.

Figure 23:
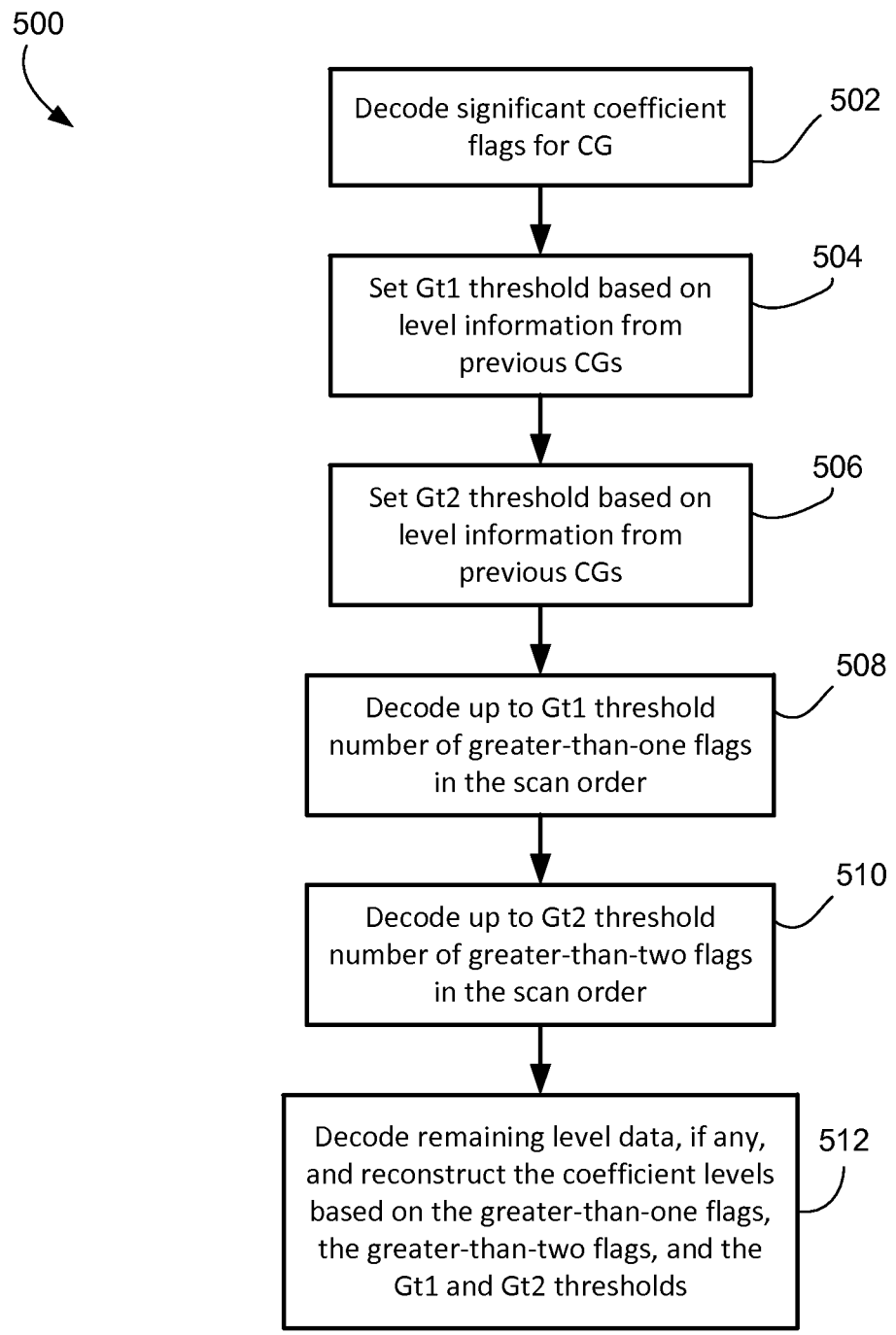
FIG. 23 shows another example method of reconstructing coefficient levels using adaptive-threshold-based level decoding.

Reference is now made to FIG. 23, which shows another example method 500 for reconstructing coefficient levels or a coefficient group. This simplified example method 500 illustrates a two-threshold embodiment of the coefficient level reconstruction process.

The method 500 includes decoding the significant-coefficient flags for the coefficient group, as indicated by operation 502. In operation 504, a first threshold is set based upon level information from one or more of the previously-decoded coefficient groups. In operation 506, a second threshold is set based upon level information from one of more of the previously-decoded coefficient groups. In one example, the first threshold is the maximum number of greater-than-one flags that will be decoded for this coefficient group and the second threshold is the maximum number of greater-than-two flags that will be decoded for this coefficient group. As discussed in connection with FIG. 22, in one example, a threshold may be based upon a count of greater-than-one coefficients in the right and lower coefficient groups. This level information may be used to determine both thresholds in this example method 500. For instance, as described above, the greater-than-one threshold, M1_i, may be set as M1_i=2 if (gt1_R+gt1_L)>1, and M1_i=8 otherwise. The greater-than-two threshold, M2_i, (i.e. the maximum number of greater-than-2 flags that are decoded in the given coefficient group), may be set to M2_i=0 if (gt1_R+gt1_L)>1, and M2_i=1 otherwise.

In another embodiment, the bottom-right diagonal neighboring coefficient group is considered as well. Let gt1_D denote the number of transform coefficients that are greater than 1 in the bottom-right diagonal neighboring coefficient group. Then, M2_i=0 if a2 R*gt1_R+a2_L*gt1_L+a2_D*gt1_D>t2, and M2_i=1 otherwise, where a2_X are weights and t2 is the switching condition value. In one specific example, a2_R=a2_L=1, a2_D=0 and t2=1.

In another embodiment, the number of greater-than-2 coefficients is used instead of the number of greater-than-1 coefficients. In another embodiment, the absolute value of coefficient levels (e.g. median or average) are used instead of the number of greater-than-1 coefficients. In yet another embodiment, a count of level flags is used instead of a count of coefficients.

In general, M2_i may be determined using some function of the level information in any previously decoded coefficient groups. For example, M2_i may be determined using a linear combination of the significance, greater-than-1, greater-than-2 and actual coefficient values in any previously coded/decoded groups. Note that the condition for determining the second threshold, M2_i, is not necessarily the same as the switching condition for determining the first threshold, M1_i.

In operation 508, the decoder decodes greater-than-one flags, in scan order, for each non-zero coefficient indicated by the decoded significant-coefficient flags up to the first threshold number (if reached).

In operation 510, the decoder decodes greater-than-two flags, in scan order, for each greater-than-one coefficient indicated by the greater-than-one flags up to the second threshold number (if reached).

It will be appreciated that operations 510 and 508 (among others) may interleaved in some embodiments.

The decoder then, in operation 512, decodes any remaining-level integers and reconstructs the coefficient levels based upon the decoded level flags, the decoded remaining-level integers, and the thresholds. In this example, the decoded level flags include the significant-coefficient flags, the greater-than-one flags (if any), and the greater-than-two flags (if any).

The following pseudo-code illustrates one example implementation of adaptive-threshold-based level flag decoding for reconstruction of coefficient levels in a video decoding process.

It will be noted that some details of the decoding process have been omitted where they are not germane to the description of the present example of coefficient level reconstruction.

| residual_coding( x0, y0, log2TrafoWidth, log2TrafoHeight, scanIdx, cIdx ) { | Descriptor |
|---|---|
| ... [decoding of last significant coefficient position] | ae(v) |
|     numCoeff = 0 | |
|     x = ( scanIdx == 3 \|\| log2TrafoWidth == 2 ) ? ( 1 << ( log2TrafoWidth − 2 ) ) : ( scanIdx == 1 ) ? 1 : 4 | |
|     y = ( scanIdx == 3 \|\| log2TrafoHeight == 2 ) ? ( 1 << ( log2TrafoHeight − 2 ) ) : ( scanIdx == 1 ) ? 4 : 1 | |
|     for( xCG = 0; xCG <= x; xCG++ ) | |
|         for( yCG = 0; yCG <= y; yCG++ ) | |
|             numG1[ xCG ][ yCG ] = 0 | |
| ... | |
| ... [decoding of significance map] | |
| ... | |
|     firstNZPosInCG = 16 | |
|     lastNZPosInCG = −1 | |
|     numSigCoeff = 0 | |
|     firstGreater1CoeffIdx = −1 | |
|     c1NumFlags = ( numG1[ xCG + 1 ][ yCG ] + numG1[ xCG ][ yCG + 1 ] >= 2 ) ? 2 : 8 | |
|     c2NumFlags = ( numG1[ xCG + 1 ][ yCG ] + numG1[ xCG ][ yCG + 1 ] >= 2 ) ? 0 : 1 | |
|     for( n = 15; n >= 0; n− − ) { | |
|         xC = ScanOrder[ log2TrafoWidth ][ log2TrafoHeight ][ scanIdx ][ n + offset ][ 0 ] | |
|         yC = ScanOrder[ log2TrafoWidth ][ log2TrafoHeight ][ scanIdx ][ n + offset ][ 1 ] | |
|         if( significant_coeff_flag[ xC ][ yC ] ) { | |
|             if( numSigCoeff < c1NumFlags ) | |
|                 coeff_abs_level_greater1_flag[ n ] | ae(v) |
|             numSigCoeff++ | |
|             if( coeff_abs_level_greater1_flag[ n ] ) { | |
|                 if( firstGreater1CoeffIdx == −1 ) | |
|                     firstGreater1CoeffIdx = n | |
|             } | |
|         } | |
|         if( lastNZPosInCG = = −1) | |
|             lastNZPosInCG = n | |
|         firstNZPosInCG = n | |
|     } | |
|     signHidden = ( lastNZPosInCG − firstNZPosInCG >= sign_hiding_threshold) ? 1 : 0 | |
|     if( firstGreater1CoeffIdx != −1 && c2NumFlags == 1) | |
|         coeff_abs_level_greater2_flag[ firstGreater1CoeffIdx] | ae(v) |
|     for(n = 15; n >= 0; n− − ) { | |
|         xC = ScanOrder[ log2TrafoWidth ][ log2TrafoHeight ][ scanIdx ][ n + offset ][ 0 ] | |
|         yC = ScanOrder[ log2TrafoWidth ][ log2TrafoHeight ][ scanIdx ][ n + offset ][ 1 ] | |
|         if( significant_coeff_flag[ xC ][ yC ] && | |
|             (!sign_data_hiding_flag \|\| !signHidden \|\| n != firstNZPosInCG) ) | |
|             coeff_sign_flag[ n ] | ae(v) |
|     } | |
|     numSigCoeff = 0 | |
|     sumAbs = 0 | |
|     for( n = 15; n >= 0; n− − ) { | |
|         xC = ScanOrder[ log2TrafoWidth ][ log2TrafoHeight ][ scanIdx ][ n + offset ][ 0 ] | |
|         yC = ScanOrder[ log2TrafoWidth ][ log2TrafoHeight ][ scanIdx ][ n + offset ][ 1 ] | |
|         if( significant_coeff_flag[ xC ][ yC ] ) { | |
|             baseLevel = 1 + coeff_abs_level_greater1_flag[ n ] + coeff_abs_level_greater2_flag[ n ] | |
|             if( baseLevel == (( numSigCoeff < c1NumFlags ) ? ( (n == firstGreater1CoeffIdx && c2NumFlags == 1) ? 3 : 2 ) : 1 ) ) | |
|                 coeff_abs_level_remaining[ n ] | ae(v) |
|             if (ceoff_abs_level_remaining[n] + baseLevel >=2) | |
|                 numG1[xCG][yCG]++ | |
|             transCoeffLevel[ x0 ][ y0 ][ cIdx ][ xC ][ yC ] = | |
|                 ( coeff_abs_level_remaining[ n ] + baseLevel ) * ( 1 − 2 * coeff_sign_flag[ n ] ) | |
|             if( sign_data_hiding_flag && signHidden ) { | |
|                 sumAbs += ( coeff_abs_level_remaining[ n ] + baseLevel ) | |
|                 if( n = = firstNZPosInCG && (sumAbs%2 == 1) ) | |
|                     transCoeffLevel[x0][y0][cIdx][xC][yC] = − transCoeffLevel[x0][y0][cIdx][xC][yC] | |
|             } | |
|             numSigCoeff++ | |

-continued

```
residual_coding( x0, y0, log2TrafoWidth, log2TrafoHeight, scanIdx, cIdx ) {                    Descriptor
            } else
                transCoeffLevel[ x0 ][ y0 ][ cIdx ][ xC ][ yC ] = 0
        }
    }
}
```

Figure 20:
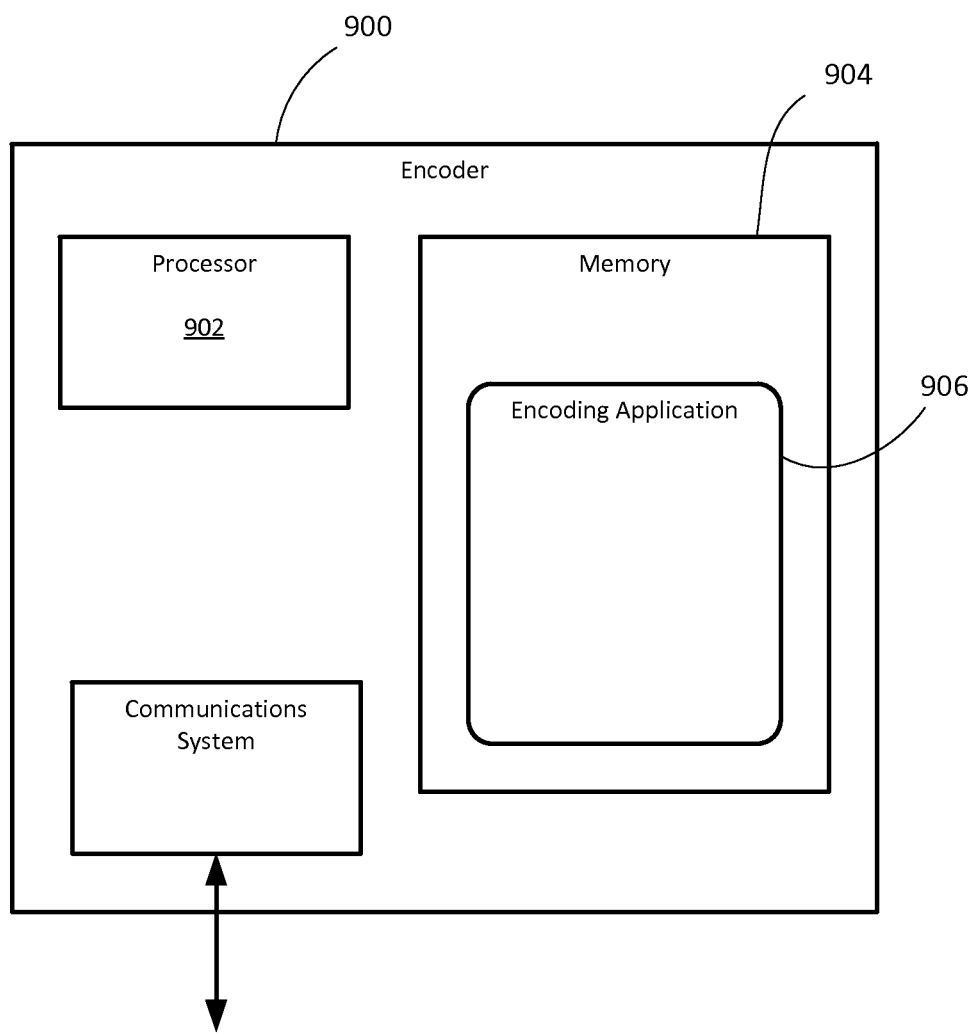
FIG. 20 shows a simplified block diagram of an example embodiment of an encoder.

Reference is now made to FIG. 20, which shows a simplified block diagram of an example embodiment of an encoder 900. The encoder 900 includes a processor 902, memory 904, and an encoding application 906. The encoding application 906 may include a computer program or application stored in memory 904 and containing instructions for configuring the processor 902 to perform operations such as those described herein. For example, the encoding application 906 may encode and output bitstreams encoded in accordance with the processes described herein. It will be understood that the encoding application 906 may be stored in on a computer readable medium, such as a compact disc, flash memory device, random access memory, hard drive, etc.

Figure 21:
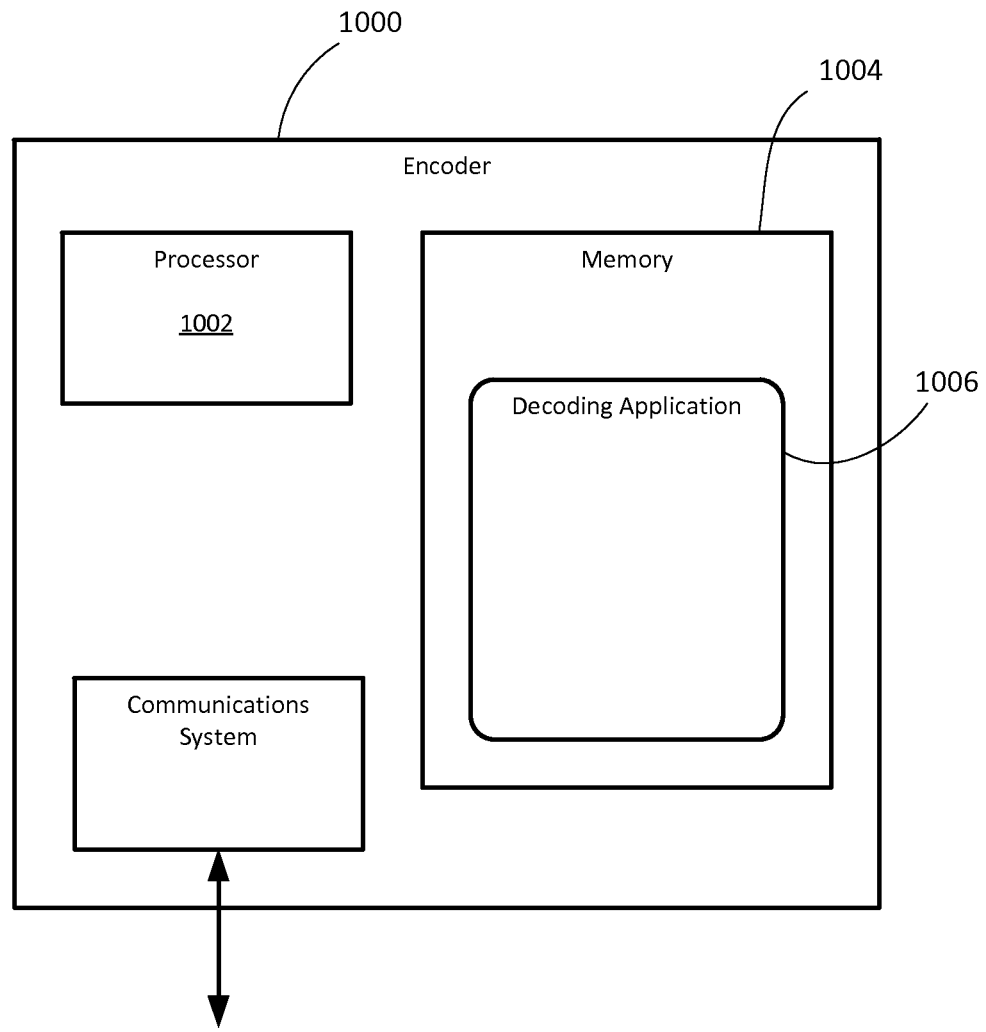
FIG. 21 shows a simplified block diagram of an example embodiment of a decoder.

Reference is now also made to FIG. 21, which shows a simplified block diagram of an example embodiment of a decoder 1000. The decoder 1000 includes a processor 1002, a memory 1004, and a decoding application 1006. The decoding application 1006 may include a computer program or application stored in memory 1004 and containing instructions for configuring the processor 1002 to perform operations such as those described herein. The decoding application 1006 may include an entropy decoder configured to reconstruct residuals based, at least in part, on reconstructing significant-coefficient flags, as described herein. It will be understood that the decoding application 1006 may be stored in on a computer readable medium, such as a compact disc, flash memory device, random access memory, hard drive, etc.

It will be appreciated that the decoder and/or encoder according to the present application may be implemented in a number of computing devices, including, without limitation, servers, suitably programmed general purpose computers, audio/video encoding and playback devices, set-top television boxes, television broadcast equipment, and mobile devices. The decoder or encoder may be implemented by way of software containing instructions for configuring a processor to carry out the functions described herein. The software instructions may be stored on any suitable non-transitory computer-readable memory, including CDs, RAM, ROM, Flash memory, etc.

It will be understood that the encoder described herein and the module, routine, process, thread, or other software component implementing the described method/process for configuring the encoder may be realized using standard computer programming techniques and languages. The present application is not limited to particular processors, computer languages, computer programming conventions, data structures, other such implementation details. Those skilled in the art will recognize that the described processes may be implemented as a part of computer-executable code stored in volatile or non-volatile memory, as part of an application-specific integrated chip (ASIC), etc.

Certain adaptations and modifications of the described embodiments can be made. Therefore, the above discussed embodiments are considered to be illustrative and not restrictive.

What is claimed is:

1. A method of reconstructing coefficient levels from a bitstream of encoded video data for a coefficient group in a transform unit, wherein the bitstream includes encoded significant-coefficient flags indicating non-zero coefficients in the coefficient group, the method comprising:
    dynamically setting a threshold based upon level information from one or more previously-reconstructed neighboring coefficient groups in the transform unit, wherein the threshold sets a maximum number of level flags that may be decoded for the coefficient group;
    decoding, in a scan order, level flags for the non-zero coefficients in the coefficient group unless the threshold number of decoded level flags is reached;
    decoding level data, if any, for non-zero coefficients in the coefficient group based upon the decoded level flags; and
    reconstructing the coefficient levels for the coefficient group from the decoded level data and the decoded level flags.

2. The method claimed in claim 1, wherein the threshold comprises a maximum number of greater-than-one flags to be decoded for the coefficient group, and wherein decoding the level flags includes decoding greater-than-one flags for the non-zero coefficients unless the maximum number of greater-than-one flags is reached.

3. The method claimed in claim 1, wherein the threshold comprises a maximum number of greater-than-two flags to be decoded for the coefficient group, and wherein decoding the level flags includes decoding greater-than-two flags for greater-than-one coefficients unless the maximum number of greater-than-two flags is reached.

4. The method claimed in claim 1, wherein the level information comprises at least one of: the number of significant-coefficient flags, the number of greater-than-one flags, the number of greater-than-two flags, the absolute value of coefficient levels, the number of greater-than-one coefficients, the number of greater-than-two coefficients, and the average value of coefficient levels.

5. The method claimed in claim 1, wherein reconstructing the coefficient levels is based upon the decoded level data, the decoded level flags, and whether the threshold was reached in decoding the level flags.

6. The method claimed in claim 1, wherein decoding level data is partly conditional upon whether the threshold was reached in decoding the level flags.

7. The method claimed in claim 1, wherein setting a threshold comprises setting a first-threshold and setting a second-threshold, and wherein decoding level flags comprises decoding first-level flags in scan order unless the first-threshold number of first-level flags is decoded and decoding second-level flags in scan order unless the second-threshold number of second-level flags is decoded.

8. The method claimed in claim 7, wherein the first-threshold comprises a maximum number of greater-than-one flags, the second-threshold comprises a maximum number of greater-than-two flags, the first-level flags comprise greaterthan-one flags, and the second-level flags comprise greater-than-two flags, and wherein the level information comprises a count of greater-than-one coefficient flags in one or more previously-reconstructed coefficient groups.

9. The method claimed in claim 8, wherein the one or more previously-reconstructed coefficient groups comprises an adjacent group to the right and an adjacent group below the coefficient group.

10. The method claimed in claim 9, wherein setting the first-threshold comprises setting the maximum number of greater-than-one flags at 2 if the sum of greater-than-one flags in the adjacent group to the right and the adjacent group below is greater than or equal to two, and otherwise setting the maximum number of greater-than-one flags at 8.

11. A decoder for reconstructing coefficient levels from a bitstream of encoded video data for a coefficient group in a transform unit, wherein the bitstream includes encoded significant-coefficient flags indicating non-zero coefficients in the coefficient group, the decoder comprising:
 a processor;
 a memory; and
 a decoding application stored in memory and containing instructions for configuring the processor to
  dynamically set a threshold based upon level information from one or more previously-reconstructed neighboring coefficient groups in the transform unit, wherein the threshold sets a maximum number of level flags that may be decoded for the coefficient group;
  decode, in a scan order, level flags for the non-zero coefficients in the coefficient group unless the threshold number of decoded level flags is reached;
  decode level data, if any, for non-zero coefficients in the coefficient group based upon the decoded level flags; and
  reconstruct the coefficient levels for the coefficient group from the decoded level data and the decoded level flags.

12. The decoder claimed in claim 11, wherein the threshold comprises a maximum number of greater-than-one flags to be decoded for the coefficient group, and wherein the processor is configured to decode the level flags by decoding greater-than-one flags for the non-zero coefficients unless the maximum number of greater-than-one flags is reached.

13. The decoder claimed in claim 11, wherein the threshold comprises a maximum number of greater-than-two flags to be decoded for the coefficient group, and wherein the processor is configured to decode the level flags by decoding greater-than-two flags for greater-than-one coefficients unless the maximum number of greater-than-two flags is reached.

14. The decoder claimed in claim 11, wherein the level information comprises at least one of: the number of significant-coefficient flags, the number of greater-than-one flags, the number of greater-than-two flags, the absolute value of coefficient levels, the number of greater-than-one coefficients, the number of greater-than-two coefficients, and the average value of coefficient levels.

15. The decoder claimed in claim 11, wherein the processor is configured to reconstruct the coefficient levels based upon the decoded level data, the decoded level flags, and whether the threshold was reached in decoding the level flags.

16. The decoder claimed in claim 11, wherein the processor is configured to decode the level data partly conditional upon whether the threshold was reached in decoding the level flags.

17. The decoder claimed in claim 11, wherein the processor is configured to set a threshold by setting a first-threshold and setting a second-threshold, and the processor is configured to decode level flags by decoding first-level flags in scan order unless the first-threshold number of first-level flags is decoded and by decoding second-level flags in scan order unless the second-threshold number of second-level flags is decoded.

18. The decoder claimed in claim 17, wherein the first-threshold comprises a maximum number of greater-than-one flags, the second-threshold comprises a maximum number of greater-than-two flags, the first-level flags comprise greater-than-one flags, and the second-level flags comprise greater-than-two flags, and wherein the level information comprises a count of greater-than-one coefficient flags in one or more previously-reconstructed coefficient groups.

19. The decoder claimed in claim 18, wherein the one or more previously-reconstructed coefficient groups comprises an adjacent group to the right and an adjacent group below the coefficient group.

20. The decoder claimed in claim 19, wherein the process is configured to set the first-threshold by setting the maximum number of greater-than-one flags at 2 if the sum of greater-than-one flags in the adjacent group to the right and the adjacent group below is greater than or equal to two, and otherwise by setting the maximum number of greater-than-one flags at 8.

21. A non-transitory processor-readable medium storing processor-executable instructions which, when executed, configure one or more processors to reconstruct coefficient levels from a bitstream of encoded video data for a coefficient group in a transform unit, wherein the bitstream includes encoded significant-coefficient flags indicating non-zero coefficients in the coefficient group, the instructions comprising:
 instructions that dynamically set a threshold based upon level information from one or more previously-reconstructed neighboring coefficient groups in the transform unit, wherein the threshold sets a maximum number of level flags that may be decoded for the coefficient group;
 instructions that decode, in a scan order, level flags for the non-zero coefficients in the coefficient group unless the threshold number of decoded level flags is reached;
 instructions that decode level data, if any, for non-zero coefficients in the coefficient group based upon the decoded level flags; and
 instructions that reconstruct the coefficient levels for the coefficient group from the decoded level data and the decoded level flags.

* * * * *